(12) United States Patent
Merriman et al.

(10) Patent No.: US 10,020,483 B2
(45) Date of Patent: Jul. 10, 2018

(54) BATTERY MODULE AND METHOD OF COUPLING FIRST AND SECOND ELECTRICAL TERMINALS OF FIRST AND SECOND BATTERY CELLS TO A VOLTAGE SENSE MEMBER OF AN INTERCONNECT ASSEMBLY

(71) Applicant: LG Chem, Ltd., Seoul (KR)

(72) Inventors: Robert Merriman, Shelby Township, MI (US); Heekook Yang, Troy, MI (US)

(73) Assignee: LG Chem, Ltd., Seoul (KR)

( * ) Notice: Subject to any disclaimer, the term of this patent is extended or adjusted under 35 U.S.C. 154(b) by 551 days.

(21) Appl. No.: 14/617,230

(22) Filed: Feb. 9, 2015

(65) Prior Publication Data
US 2016/0233477 A1   Aug. 11, 2016

(51) Int. Cl.
*H01M 2/20* (2006.01)
*H01R 43/02* (2006.01)
(Continued)

(52) U.S. Cl.
CPC ........ *H01M 2/204* (2013.01); *G01R 31/3658* (2013.01); *G01R 31/3696* (2013.01);
(Continued)

(58) Field of Classification Search
CPC ....... H01M 2/202; H01M 2/204; H01M 2/206
See application file for complete search history.

(56) References Cited

U.S. PATENT DOCUMENTS 4,409,304 A    10/1983  Gerard et al.
5,503,948 A     4/1996  Mackay et al.
(Continued)

FOREIGN PATENT DOCUMENTS

EP    1089373 A     4/2001
EP    1505670 A2    2/2005
(Continued)

OTHER PUBLICATIONS

European Search Report for European Patent Application No. 16749428.5 dated Nov. 20, 2017.
(Continued)

*Primary Examiner* — Miriam Stagg
*Assistant Examiner* — Brent C Thomas
(74) *Attorney, Agent, or Firm* — Buckert Patent & Trademark Law Firm PC; John F. Buckert

(57) ABSTRACT

A battery module and a method are provided. The battery module includes a first battery cell having a first electrical terminal, a second battery cell having a second electrical terminal, and an interconnect assembly having a plate portion, a first finger portion, and a first voltage sense member. The first voltage sense member is coupled to the first finger portion. The first electrical terminal has a first terminal portion disposed directly on and coupled to a first voltage sense wall of the first voltage sense member. The second electrical terminal has a first terminal portion disposed on and coupled to the first terminal portion of the first electrical terminal such that the first terminal portion of the first electrical terminal is sandwiched between the first voltage sense wall of the first voltage sense member and the first terminal portion of the second electrical terminal.

7 Claims, 29 Drawing Sheets

(51) Int. Cl.
  *H01M 10/48* (2006.01)
  *B23K 26/22* (2006.01)
  *G01R 31/36* (2006.01)
  *H01M 10/42* (2006.01)

(52) U.S. Cl.
  CPC ........... *H01M 2/202* (2013.01); *H01M 2/206* (2013.01); *H01M 10/425* (2013.01); *H01M 10/482* (2013.01); *H01R 43/0221* (2013.01)

(56) References Cited

U.S. PATENT DOCUMENTS

| | | |
|---|---|---|
| 5,639,571 A | 6/1997 | Waters et al. |
| 5,856,041 A | 1/1999 | Inoue et al. |
| 6,023,146 A | 2/2000 | Casale et al. |
| 6,261,719 B1 | 7/2001 | Ikeda et al. |
| 6,521,363 B1 | 2/2003 | Yeh |
| 6,555,264 B1 | 4/2003 | Hamada et al. |
| 6,773,301 B1 | 8/2004 | Chaskin |
| 7,229,327 B2 | 6/2007 | Zhao et al. |
| 7,270,576 B2 | 9/2007 | Kim et al. |
| 7,270,912 B2 | 9/2007 | Oogami |
| 7,294,020 B2 | 11/2007 | Zhao et al. |
| 7,507,124 B2 | 3/2009 | Kim |
| 7,563,137 B1 | 7/2009 | Koetting et al. |
| 7,578,702 B1 | 8/2009 | Tom et al. |
| 7,642,746 B2 | 1/2010 | Kim et al. |
| 7,762,848 B2 | 7/2010 | Koetting et al. |
| 8,035,986 B2 | 10/2011 | Koetting et al. |
| 2001/0049055 A1 | 12/2001 | Saito |
| 2003/0027039 A1 | 2/2003 | Benson et al. |
| 2003/0213121 A1 | 11/2003 | Rouillard et al. |
| 2004/0043663 A1 | 3/2004 | Ikeda et al. |
| 2005/0031945 A1 | 2/2005 | Morita et al. |
| 2005/0130033 A1 | 6/2005 | Iwamura et al. |
| 2006/0127754 A1 | 6/2006 | Hamada et al. |
| 2006/0177733 A1 | 8/2006 | Ha et al. |
| 2006/0194101 A1 | 8/2006 | Ha et al. |
| 2006/0234558 A1 | 10/2006 | Li |
| 2006/0246781 A1 | 11/2006 | Yoon et al. |
| 2007/0238018 A1 | 10/2007 | Lee et al. |
| 2008/0124617 A1 | 5/2008 | Bjork |
| 2008/0169788 A1 | 7/2008 | Bobbin et al. |
| 2008/0254356 A1 | 10/2008 | Liersch et al. |
| 2009/0139781 A1 | 6/2009 | Straubel |
| 2009/0323293 A1 | 12/2009 | Koetting et al. |
| 2009/0325042 A1 | 12/2009 | Koetting et al. |
| 2010/0062329 A1 | 3/2010 | Muis |
| 2010/0247998 A1 | 9/2010 | Hostler et al. |
| 2011/0293994 A1 | 12/2011 | Casoli |
| 2012/0088140 A1 | 4/2012 | Kardasz et al. |
| 2013/0029204 A1 | 1/2013 | Khakhalev et al. |
| 2013/0052503 A1 | 2/2013 | Payne |
| 2013/0052511 A1 | 2/2013 | Khakhalev |
| 2013/0078487 A1* | 3/2013 | Shin ................. H01M 10/482 429/62 |
| 2013/0216878 A1* | 8/2013 | Merriman ............. H01M 2/206 429/92 |

FOREIGN PATENT DOCUMENTS

| | | |
|---|---|---|
| EP | 2937706 A1 | 10/2015 |
| GB | 2084390 A | 4/1982 |
| JP | 2000123802 A | 4/2000 |
| JP | 2000164200 A | 6/2000 |
| JP | 2002252036 A | 9/2002 |
| JP | 2003282044 A | 10/2003 |
| JP | 2004055492 A | 2/2004 |
| JP | 2004178860 A | 6/2004 |
| JP | 2007265945 A | 10/2007 |
| KR | 20020051742 A | 6/2002 |
| KR | 20020064366 A | 8/2002 |
| KR | 20060110408 A | 10/2006 |
| KR | 20070057662 A | 6/2007 |
| KR | 20070100555 A | 10/2007 |
| KR | 20080027504 A | 3/2008 |
| KR | 20080027505 A | 3/2008 |
| KR | 20080036258 A | 4/2008 |
| KR | 20090095949 A | 9/2009 |
| KR | 100996957 B | 1/2010 |
| KR | 101042611 B | 1/2010 |
| KR | 20100003146 A | 1/2010 |
| KR | 101050318 B | 10/2010 |
| WO | 0030190 A | 5/2000 |
| WO | 2014148791 A1 | 9/2014 |

OTHER PUBLICATIONS

International Search Report for International application No. PCT/KR2012/006812 dated Feb. 27, 2013.
International Search Report for International application No. PCT/KR2012/006813 dated Feb. 14, 2013.
International Search Report for International application No. PCT/KR2013/001174 dated May 13, 2013.
International Search Report for International Patent Application No. PCT/KR2009/003438 dated Jan. 22, 2010.
International Search Report for International Patent Application No. PCT/KR2009/003440 dated Jan. 22, 2010.
U.S. Appl. No. 14/246,178, filed Apr. 7, 2014 entitled Battery Cell Interconnect and Voltage Sensing Assembly and a Battery Module.
U.S. Appl. No. 14/617,344, filed Feb. 9, 2015 entitled Battery Module and Method of Coupling First and Second Electrical Terminals of First and Second Battery Cells to First and Second Voltage Sense Members of an Interconnect Assembly.

* cited by examiner

BATTERY MODULE AND METHOD OF COUPLING FIRST AND SECOND ELECTRICAL TERMINALS OF FIRST AND SECOND BATTERY CELLS TO A VOLTAGE SENSE MEMBER OF AN INTERCONNECT ASSEMBLY

BACKGROUND

The inventors herein have recognized a need for an improved battery module and a method of coupling first and second electrical terminals of first and second battery cells, respectively, to a voltage sense member of an interconnect assembly.

SUMMARY

A battery module in accordance with an exemplary embodiment is provided. The battery module includes a first battery cell having a first electrical terminal. The battery module further includes a second battery cell having a second electrical terminal. The battery module further includes an interconnect assembly having a plate portion, first finger portion, and a first voltage sense member. The first finger portion is coupled to and extends from a first end of the plate portion. The first finger portion has first and second side surfaces and a first flat outer surface. The first flat outer surface of the first finger portion is disposed between the first and second side surfaces of the first finger portion. The first voltage sense member is coupled to the first finger portion. The first voltage sense member has first, second, and third voltage sense walls. The second and third voltage sense walls of the first voltage sense member are coupled to and extend from first and second ends, respectively, of the first voltage sense wall of the first voltage sense member. The second and third voltage sense walls of the first voltage sense member extend substantially perpendicular to the first voltage sense wall of the first voltage sense member. The first voltage sense wall of the first voltage sense member is disposed directly on the first flat outer surface of the first finger portion. The second and third voltage sense walls of the first voltage sense member are disposed directly on the first and second side surfaces, respectively, of the first finger portion. The first electrical terminal has a first terminal portion disposed directly on and coupled to the first voltage sense wall of the first voltage sense member. The second electrical terminal has a first terminal portion disposed on and coupled to the first terminal portion of the first electrical terminal such that the first terminal portion of the first electrical terminal is sandwiched between the first voltage sense wall of the first voltage sense member and the first terminal portion of the second electrical terminal.

A method of coupling first and second electrical terminals of first and second battery cells, respectively, to a first voltage sense member of an interconnect assembly, in accordance with another exemplary embodiment is provided. The method includes providing the interconnect assembly having a plate portion, a first finger portion, and the first voltage sense member. The first finger portion is coupled to and extends from a first end of the plate portion. The first finger portion has first and second side surfaces and a first flat outer surface. The first flat outer surface of the first finger portion is disposed between the first and second side surfaces of the first finger portion. The first voltage sense member is coupled to the first finger portion. The first voltage sense member has first, second, and third voltage sense walls. The second and third voltage sense walls of the first voltage sense member are coupled to and extend from first and second ends, respectively, of the first voltage sense wall of the first voltage sense member. The second and third voltage sense walls of the first voltage sense member extend substantially perpendicular to the first voltage sense wall of the first voltage sense member. The first voltage sense wall of the first voltage sense member is disposed directly on the first flat outer surface of the first finger portion. The second and third voltage sense walls of the first voltage sense member are disposed directly on the first and second side surfaces, respectively, of the first finger portion. The method further includes disposing a first terminal portion of the first electrical terminal directly on the first voltage sense wall of the first voltage sense member. The method further includes disposing a first terminal portion of the second electrical terminal directly on the first terminal portion of the first electrical terminal such that the first terminal portion of the first electrical terminal is sandwiched between the first voltage sense wall of the first voltage sense member and the first terminal portion of the second electrical terminal. The method further includes applying a laser welding beam to an outer surface of the first terminal portion of the second electrical terminal to weld together the first terminal portion of the second electrical terminal, the first terminal portion of the first electrical terminal, and the first voltage sense member.

A battery module in accordance with another exemplary embodiment is provided. The battery module includes a first battery cell having a first electrical terminal. The battery module further includes a second battery cell having a second electrical terminal. The battery module further includes an interconnect assembly having a plate portion, first and second finger portions, and first and second voltage sense members. The first finger portion is coupled to and extends from a first end of the plate portion. The first finger portion has first and second side surfaces and a first flat outer surface. The first flat outer surface of the first finger portion is disposed between the first and second side surfaces of the first finger portion. The first voltage sense member is coupled to the first finger portion. The first voltage sense member has a first voltage sense wall disposed directly on the first flat outer surface of the first finger portion. The second finger portion is coupled to and extends from the first end of the plate portion. The second finger portion extends substantially parallel to the first finger portion and is spaced apart from the first finger portion such a first gap is defined between the second finger portion and the first finger portion. The second finger portion has first and second side surfaces and a first flat outer surface. The first flat outer surface of the second finger portion is disposed between the first and second side surfaces of the second finger portion. The second voltage sense member is coupled to the second finger portion. The second voltage sense member has a first voltage sense wall disposed directly on the first flat outer surface of the second finger portion. The battery module further includes a first frame member disposed between the first and second battery cells. The first frame member has a first plastic frame and a first frame extension portion extending outwardly from the first plastic frame. The first battery cell is disposed against a first side of the first plastic frame. The second battery cell is disposed against a second side of the first plastic frame. The first frame extension portion extends through the first gap substantially parallel to the first and second finger portions. The first electrical terminal extends through the first gap and between the first frame extension portion and the first finger portion. The first electrical terminal has a first terminal portion coupled to the first voltage sense member. The second electrical terminal extends through the first gap and between the first frame extension portion and the second finger portion. The second electrical terminal has a first terminal portion coupled to the second voltage sense member such that the first frame extension portion electrically isolates the first electrical terminal from the second electrical terminal.

A method of coupling first and second electrical terminals of first and second battery cells, respectively, to first and second voltage sense members, respectively, of an interconnect assembly in accordance with another exemplary embodiment is provided. The method includes providing the interconnect assembly having a plate portion, first and second finger portions, and the first and second voltage sense members. The first finger portion is coupled to and extends from a first end of the plate portion. The first finger portion has first and second side surfaces and a first flat outer surface. The first flat outer surface of the first finger portion is disposed between the first and second side surfaces of the first finger portion. The first voltage sense member is coupled to the first finger portion. The first voltage sense member has a first voltage sense wall disposed directly on the first flat outer surface of the first finger portion. The second finger portion is coupled to and extends from the first end of the plate portion. The second finger portion extends substantially parallel to the first finger portion and is spaced apart from the first finger portion such a first gap is defined between the second finger portion and the first finger portion. The second finger portion has first and second side surfaces and a first flat outer surface. The first flat outer surface of the second finger portion is disposed between the first and second side surfaces of the second finger portion. The second voltage sense member is coupled to the second finger portion. The second voltage sense member has a first voltage sense wall disposed directly on the first flat outer surface of the second finger portion. The method further includes providing a first frame member having a first plastic frame and a first frame extension portion extending outwardly from the first plastic frame. The method further includes disposing the first frame member between the first and second battery cells such that the first battery cell is disposed against a first side of the first plastic frame, and the second battery cell is disposed against a second side of the first plastic frame. The first frame extension portion extends through the first gap substantially parallel to the first and second finger portions. The method further includes disposing the interconnect assembly proximate to the first and second battery cells such that the first electrical terminal extends through the first gap and between the first frame extension portion and the first finger portion, and the second electrical terminal extends through the first gap and between the first frame extension portion and the second finger portion. The method further includes welding a first terminal portion of the first electrical terminal to the first voltage sense member. The method further includes welding a first terminal portion of the second electrical terminal to the second voltage sense member, such that the first frame extension portion electrically isolates the first electrical terminal from the second electrical terminal.

DETAILED DESCRIPTION

Figure 1:
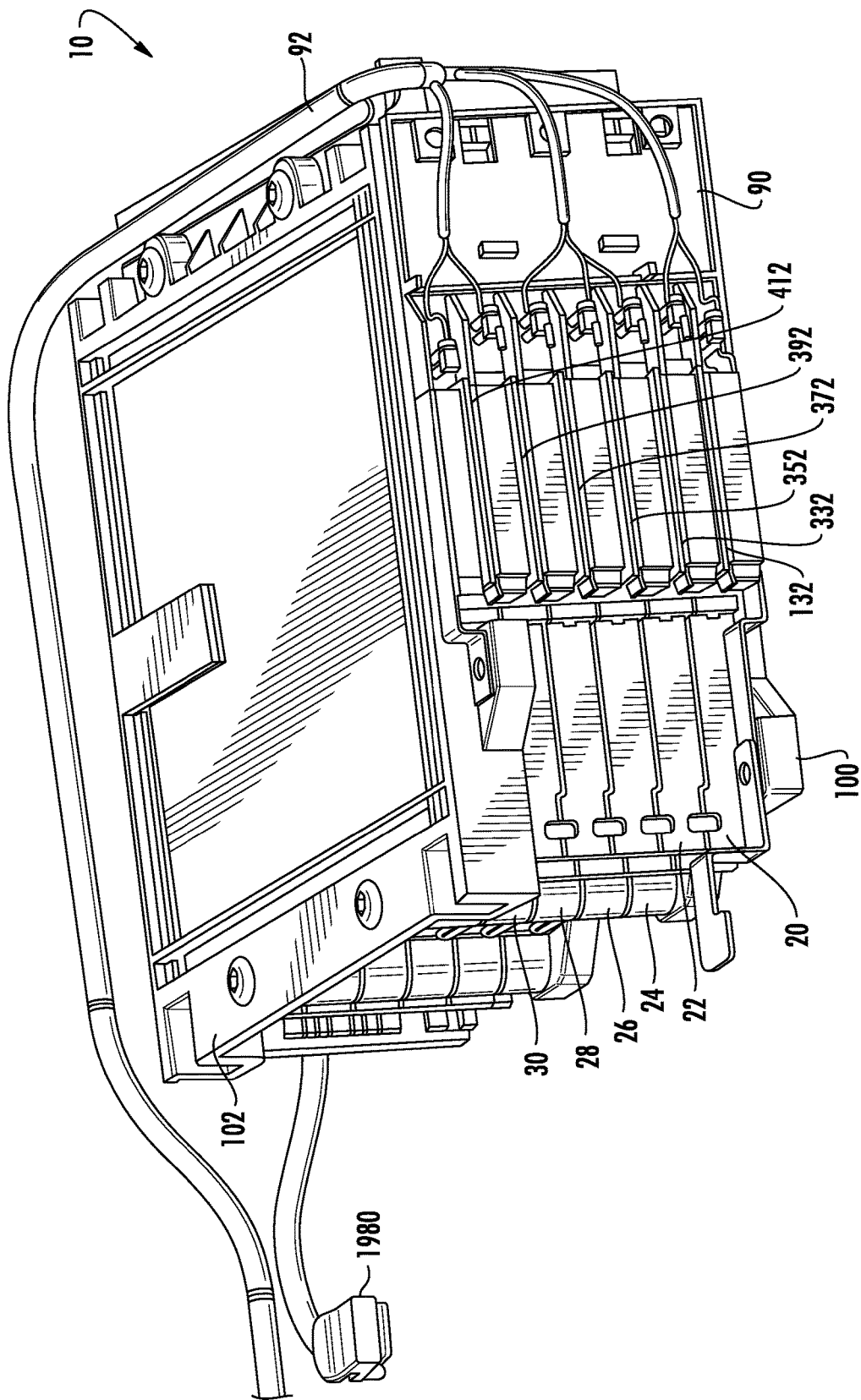
FIG. 1 is a schematic of a battery module in accordance with an exemplary embodiment.

Referring to FIGS. 1-5, a battery module 10 in accordance with an exemplary embodiment is provided. The battery module 10 includes frame members 20, 22, 24, 26, 28, 30, battery cells 40, 42, 44, 46, 48, 50, 52, 54, 56, 58, 60, 62, an interconnect assembly 90, a removable wire harness assembly 92, an interconnect assembly 94, a removable wire harness assembly 96, and end plates 100, 102. An advantage of the battery module 10 is that the module 10 utilizes interconnect assemblies 90, 94 each having voltage sense members which can be readily laser welded to electrical terminals of battery cells.

Further, the battery module 10 utilizes frame extension portions on frame members and blade portions on an interconnect assembly to electrically isolate each pair of electrical terminals disposed proximate to one another that are separated by an air gap to prevent electrical discharges across the air gap. In particular, when a frame extension portion of a frame member electrically isolates a first electrical terminal from a second electrical terminal, the frame extension portion disposed between the first and second electrical terminals is adapted to prevent an electrical discharge across an air gap between the first and second electrical terminals. Also, when a blade portion electrically isolates a first electrical terminal from a second electrical terminal, the blade portion disposed between the first and second electrical terminals is adapted to prevent an electrical discharge across an air gap between the first and second electrical terminals.

Referring to FIGS. 1, 5 and 8-12, the frame members 20, 22, 24, 26, 28, 30 are provided to hold the battery cells 40-62 therebetween. The frame member 20 is coupled to and between the frame member 22 and the end plate 100. The frame member 22 is coupled to and between the frame members 20, 24. The frame member 26 is coupled to and between frame members 24, 28. Further, the frame member 28 is coupled to and between frame members 26, 30. The frame member 30 is coupled to and between the frame member 28 and the end plate 102. The structure of each of the frame members 20-30 are identical to one another.

Figure 11:
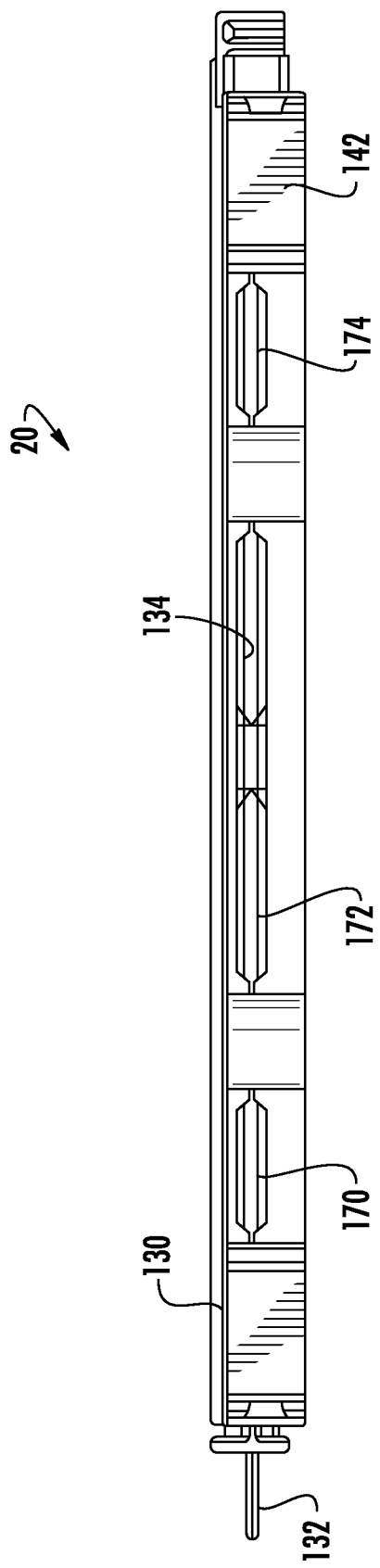
FIG. 11 is a side view of the frame member of FIG. 8.
Figure 12:
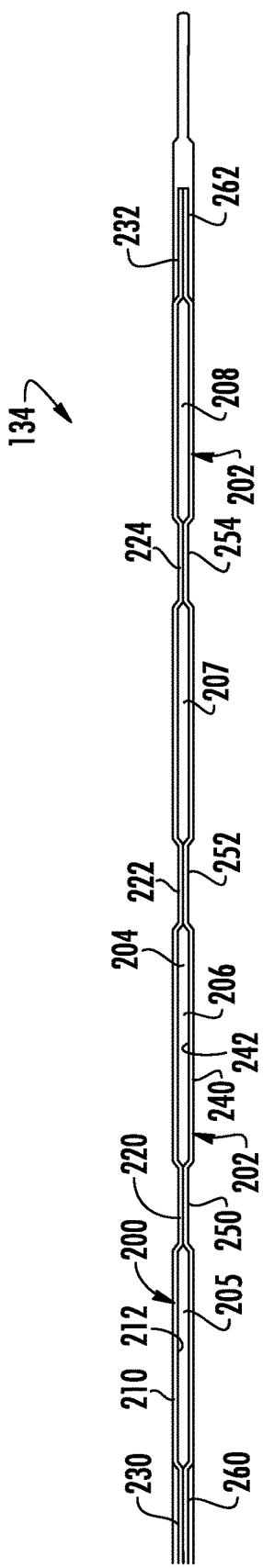
FIG. 12 is a cross-sectional schematic of the frame member of FIG. 8.

Referring to FIGS. 8-12, the frame member 20 has substantially rectangular ring-shaped outer plastic frame 130, a frame extension portion 132, and a heat exchanger 134. Referring to FIG. 12, the heat exchanger 134 has first and second thermally conductive plates 200, 202 that are coupled together and define a flow path portion 204 that extends therethrough. The flow path portion 204 has flow path subportions 205, 206, 207, 208 each extending through the first and second thermally conductive plates 200, 202.

Referring to FIGS. 8-12, the substantially rectangular ring-shaped outer plastic frame 130 is coupled around an outer peripheral region of the first and second thermally conductive plates 200, 202. The rectangular ring-shaped outer plastic frame 130 has first, second, third, and fourth side walls 140, 142, 144, 146. The first and second side walls 140, 142 extend substantially parallel to one another. The third and fourth side walls 144, 146 are coupled between the first and second side walls 140, 142 and extend substantially parallel to one another and perpendicular to the first and second side walls 140, 142.

Figure 8:
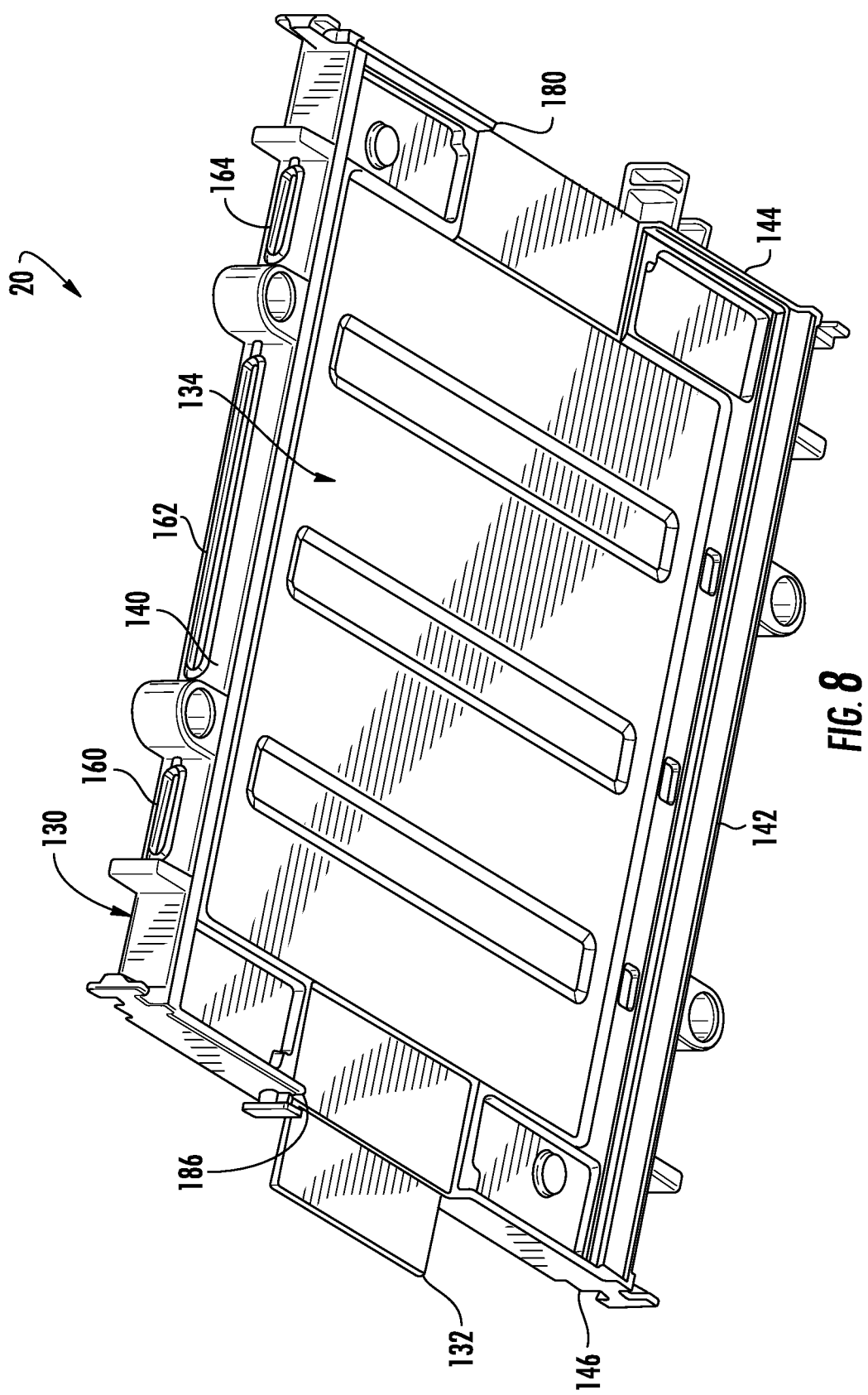
FIG. 8 is a schematic of a frame member utilized in the battery module of FIG. 1.
Figure 9:
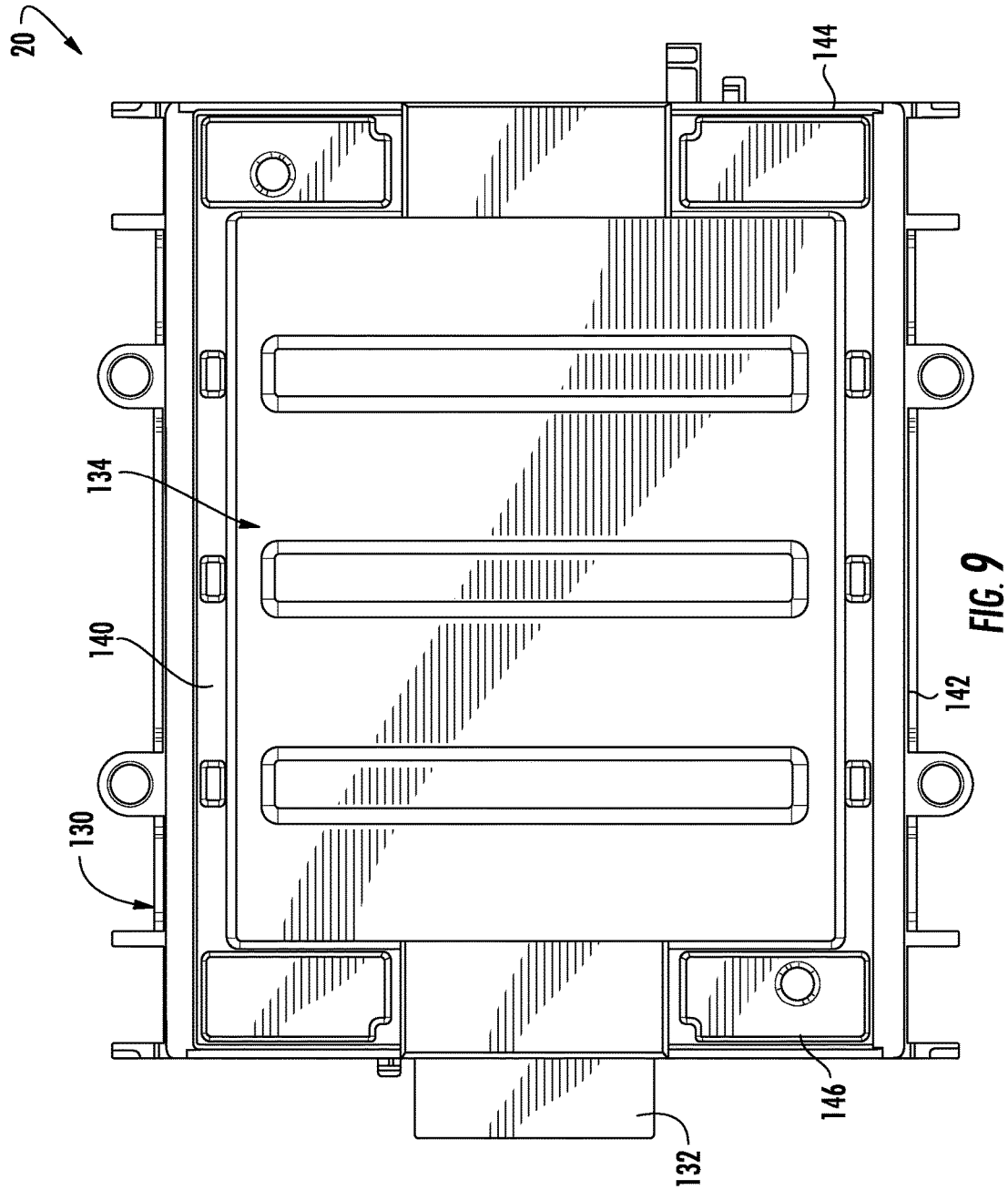
FIG. 9 is a top view of the frame member of FIG. 8.
Figure 10:
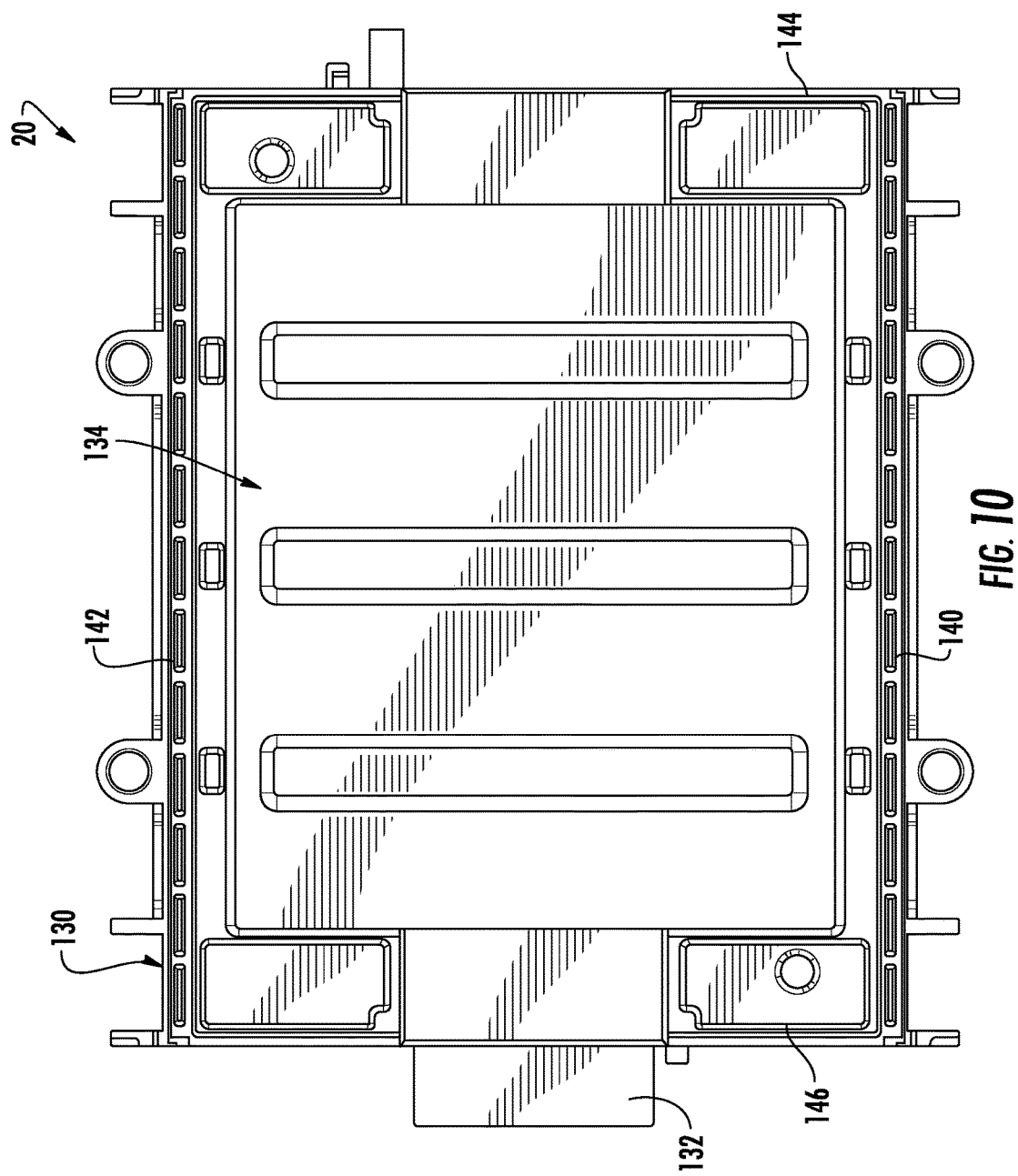
FIG. 10 is a bottom view of the frame member of FIG. 8.

Referring to FIGS. 8 and 12, the first side wall 140 has apertures 160, 162, 164 extending therethrough. The aperture 160 fluidly communicates with the flow path subportions 205. Also, the aperture 162 fluidly communicates with the flow path subportions 206, 207. Further, the aperture 164 fluidly communicates with the flow path subportion 208. Referring to FIGS. 11 and 12, the second side wall 142 has apertures 170, 172, 174 extending therethrough. The aperture 170 fluidly communicates with the flow path subportion 205. Also, the aperture 172 fluidly communicates with the flow path subportions 206, 207. Further, the aperture 174 fluidly communicates with the flow path subportion 208. The third side wall 144 has a groove 180 extending therein, and the fourth side wall 146 has a groove 186 extending therein. The grooves 180, 186 are configured to receive first and second electrical terminals of a battery cell therethrough.

Figure 6:
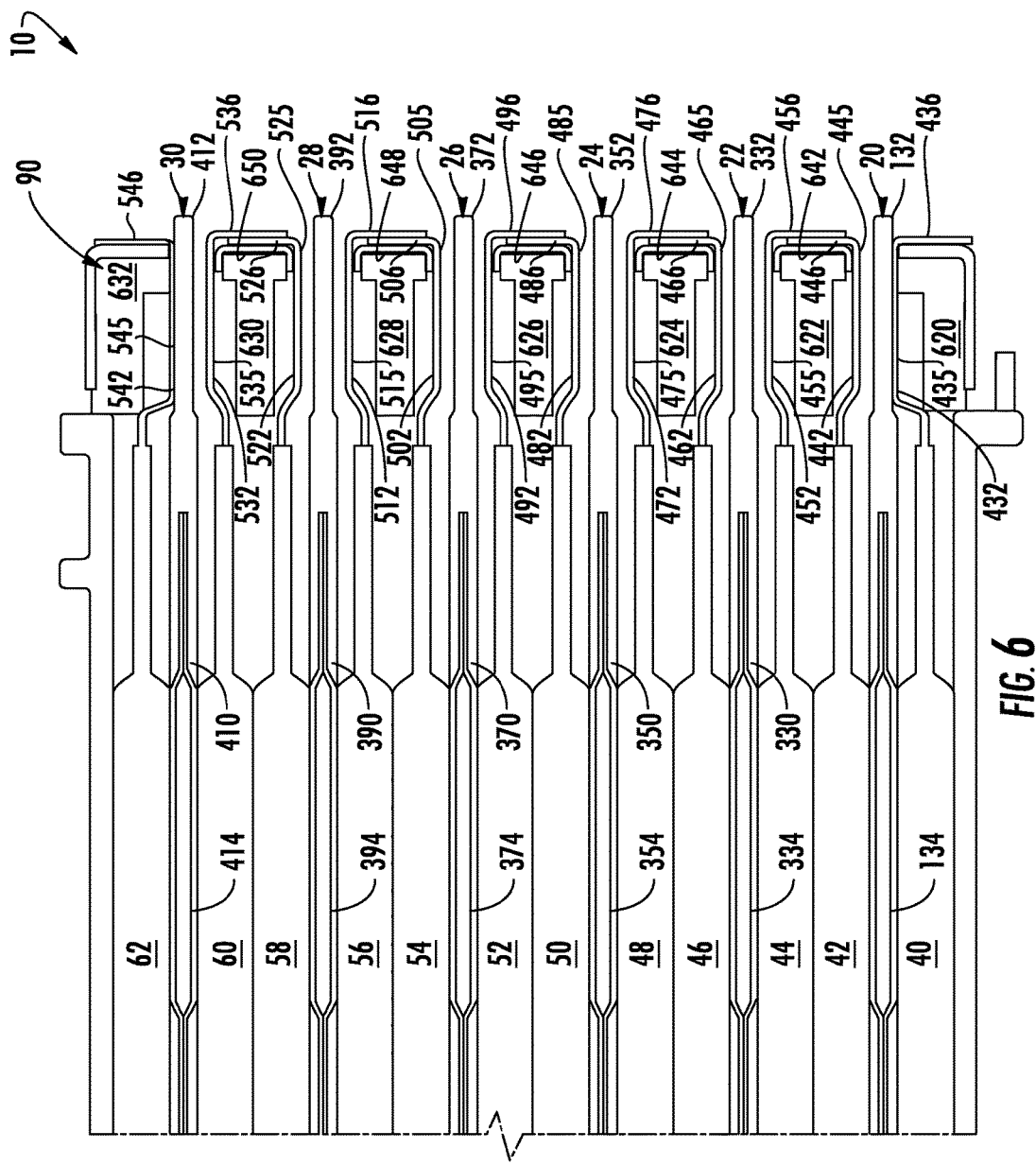
FIG. 6 is an enlarged view of a portion of the cross-sectional schematic of the battery module of FIG. 5.

Referring to FIGS. 6 and 8, the frame extension portion 132 is coupled to and extends outwardly from the fourth side wall 144 of the substantially rectangular ring-shaped outer plastic frame 130. Further, the frame extension portion 132 extends outwardly from the frame 130 through a gap between the finger portions 620, 622. In an exemplary embodiment, the frame extension portion 132 is constructed of plastic.

Referring to FIG. 12, the heat exchanger 134 includes first and second thermally conductive plates 200, 202 that are coupled together and define the flow path portion 204 defined between the plates 200, 202. The first thermally conductive plate 200 has a first side 210 and a second side 212. The first thermally conductive plate 200 further includes elongated depressed portions 220, 222, 224 and depressed edge portions 230, 232. In an exemplary embodiment, the first thermally conductive plate 200 is constructed of aluminum and is substantially rectangular-shaped. The second thermally conductive plate 202 has a first side 240 and a second side 242. The second thermally conductive plate 202 further includes elongated depressed portions 250, 252, 254 and depressed edge portions 260, 262. In an exemplary embodiment, the second thermally conductive plate 202 is constructed of aluminum and is substantially rectangular-shaped. The first thermally conductive plate 200 is coupled to the second thermally conductive plate 202 such that the elongated depressed portions 220, 222, 224 contact and are coupled to the elongated depressed portions 250, 252, 254, respectively and the depressed edge portions 230, 232 contact and are coupled to the depressed edge portions 260, 262. The plates 200, 202 define the flow path portion 204 having the flow path subportions 205, 206, 207, 208 that extend entirely through a longitudinal length of the plates 200, 202 that receives air therethrough for cooling the adjacent battery cells.

Figure 5:
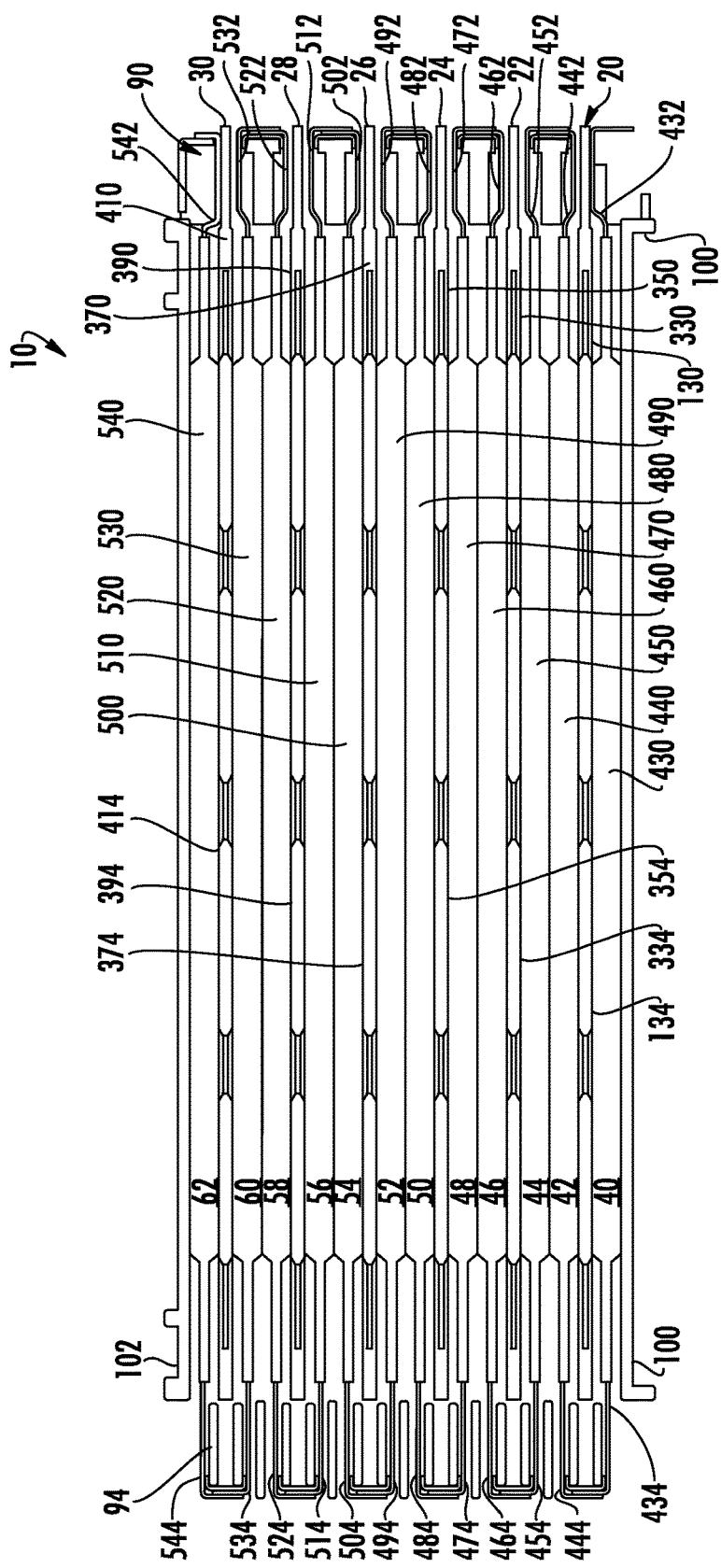
FIG. 5 is a cross-sectional schematic of the battery module of FIG. 3 taken along lines 5-5.

Referring to FIGS. 1, 5 and 6, the frame member 22 has a substantially rectangular ring-shaped outer plastic frame 330, a frame extension portion 332, and a heat exchanger 334. The frame extension portion 332 extends outwardly from the frame 330 through a gap between the finger portions 622, 624.

The frame member 24 has a substantially rectangular ring-shaped outer plastic frame 350, a frame extension portion 352, and a heat exchanger 354. The frame extension portion 352 extends outwardly from the frame 350 through a gap between the finger portions 624, 626.

The frame member 26 has a substantially rectangular ring-shaped outer plastic frame 370, a frame extension portion 372, and a heat exchanger 374. The frame extension portion 372 extends outwardly from the frame 370 through a gap between the finger portions 626, 628.

The frame member 28 has a substantially rectangular ring-shaped outer plastic frame 390, a frame extension portion 392, and a heat exchanger 394. The frame extension portion 392 extends outwardly from the frame 390 through a gap between the finger portions 628, 630.

The frame member 30 has a substantially rectangular ring-shaped outer plastic frame 410, a frame extension portion 412, and a heat exchanger 414. The frame extension portion 412 extends outwardly from the frame 410 through a gap between the finger portions 630, 632.

Referring to FIG. 5, the frame member 20 and the end plate 100 are configured to hold the battery cell 40 therebetween. Further, the heat exchanger 134 of the frame member 20 is disposed between and contacts the battery cells 40, 42.

The frame members 20, 22 are configured to hold the battery cells 42, 44 therebetween. Further, the heat exchanger 334 of the frame member 22 is disposed between and contacts the battery cells 44, 46.

The frame members 22, 24 are configured to hold the battery cells 46, 48 therebetween. Further, the heat exchanger 354 of the frame member 24 is disposed between and contacts the battery cells 48, 50.

The frame members 24, 26 are configured to hold the battery cells 50, 52 therebetween. Further, the heat exchanger 374 of the frame member 26 is disposed between and contacts the battery cells 52, 54.

The frame members 26, 28 are configured to hold the battery cells 54, 56 therebetween. Further, the heat exchanger 394 of the frame member 28 is disposed between and contacts the battery cells 56, 58.

The frame members 28, 30 are configured to hold the battery cells 58, 60 therebetween. Further, the heat exchanger 414 of the frame member 30 is disposed between and contacts the battery cells 60, 62. The battery cell 62 is disposed and held between the frame member 30 and the end plate 102.

The battery cells 40, 42, 44, 46, 48, 50, 52, 54, 56, 58, 60, 62 are each configured to generate an operational voltage. In one exemplary embodiment, the battery cells 40-62 are pouch-type lithium-ion battery cells that have a substantially rectangular-shaped body portion and a pair of electrical terminals. In an exemplary embodiment, the battery cells 40-62 are electrically coupled in series with one another utilizing the interconnect assemblies 90, 94. Further, in an exemplary embodiment, the electrical terminals of the battery cells 40-62 are coupled to the interconnect assemblies 90, 94 by welding the electrical terminals of the battery cells 40-62 to the interconnect assemblies 90, 94 utilizing a laser. In an exemplary embodiment, the structure of the battery cells 40-62 are identical to one another.

Figure 7:
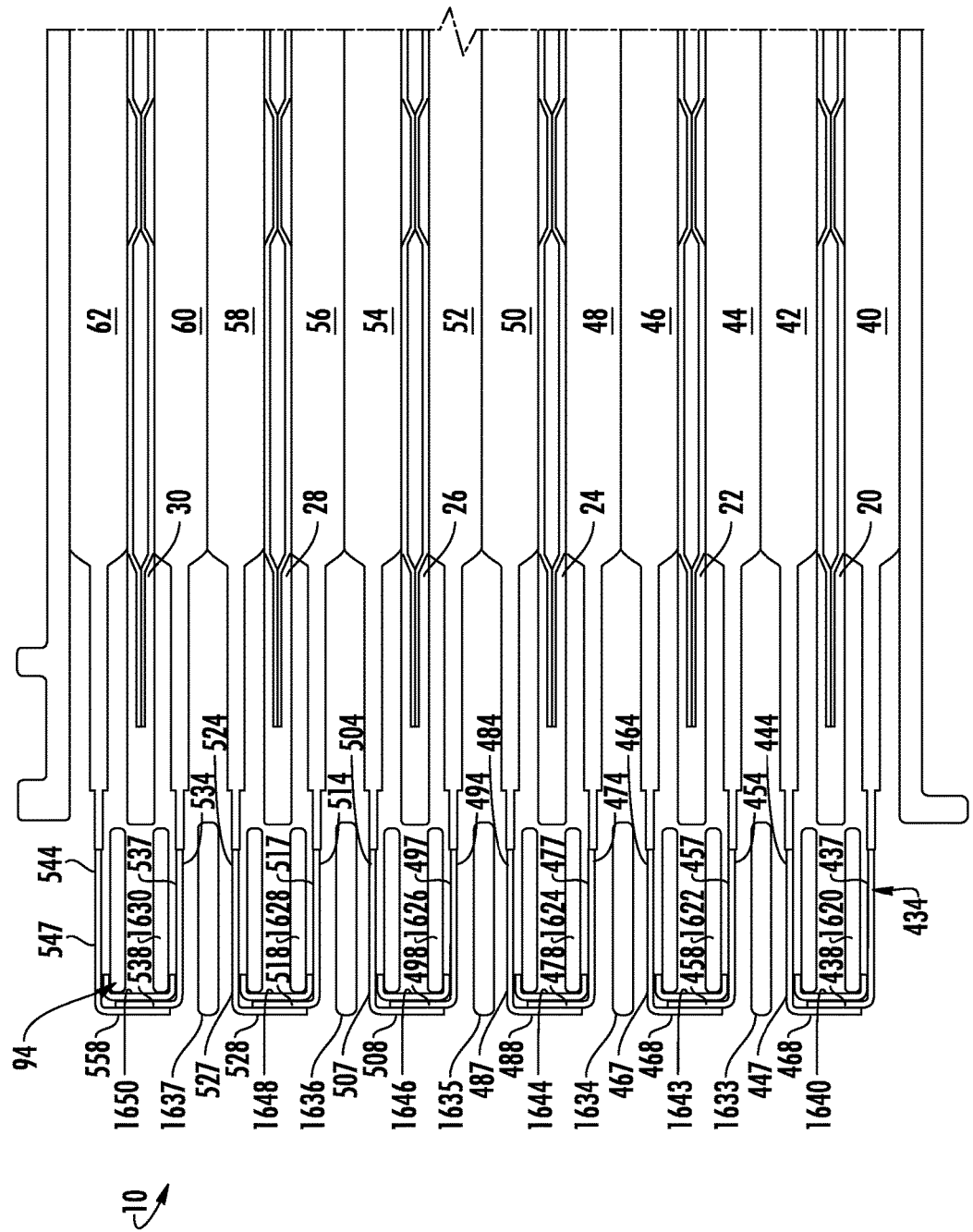
FIG. 7 is an enlarged view of another portion of the cross-sectional schematic of the battery module of FIG. 5.

Referring to FIGS. 5-7, the battery cell 40 has a rectangular-shaped housing 430 with electrical terminals 432, 434, extending from first and second ends, respectively, of the housing 430. The electrical terminal 432 includes terminal portions 435, 436. Further, the electrical terminal 434 includes terminal portions 437, 438.

The battery cell 42 has a rectangular-shaped housing 440 with electrical terminals 442, 444, extending from first and second ends, respectively, of the housing 440. The electrical terminal 442 includes terminal portions 445, 446. Further, the electrical terminal 444 includes terminal portions 447, 448.

The battery cell 44 has a rectangular-shaped housing 450 with electrical terminals 452, 454, extending from first and second ends, respectively, of the housing 450. The electrical terminal 452 includes terminal portions 455, 456. Further, the electrical terminal 454 includes terminal portions 457, 458.

The battery cell 46 has a rectangular-shaped housing 460 with electrical terminals 462, 464, extending from first and second ends, respectively, of the housing 460. The electrical terminal 462 includes terminal portions 465, 466. Further, the electrical terminal 464 includes terminal portions 467, 468.

The battery cell 48 has a rectangular-shaped housing 470 with electrical terminals 472, 474, extending from first and second ends, respectively, of the housing 470. The electrical terminal 472 includes terminal portions 475, 476. Further, the electrical terminal 474 includes terminal portions 477, 478.

The battery cell 50 has a rectangular-shaped housing 480 with electrical terminals 482, 484, extending from first and second ends, respectively, of the housing 480. The electrical terminal 482 includes terminal portions 485, 486. Further, the electrical terminal 484 includes terminal portions 487, 488.

The battery cell 52 has a rectangular-shaped housing 490 with electrical terminals 492, 494, extending from first and second ends, respectively, of the housing 490. The electrical terminal 492 includes terminal portions 495, 496. Further, the electrical terminal 494 includes terminal portions 497, 498.

The battery cell 54 has a rectangular-shaped housing 500 with electrical terminals 502, 504 extending from first and second ends, respectively, of the housing 500. The electrical terminal 502 includes terminal portions 505, 506. Further, the electrical terminal 504 includes terminal portions 507, 508.

The battery cell 56 has a rectangular-shaped housing 510 with electrical terminals 512, 514 extending from first and second ends, respectively, of the housing 510. The electrical terminal 512 includes terminal portions 515, 516. Further, the electrical terminal 514 includes terminal portions 517, 518.

The battery cell 58 has a rectangular-shaped housing 520 with electrical terminals 522, 524 extending from first and second ends, respectively, of the housing 520. The electrical terminal 522 includes terminal portions 525, 526. Further, the electrical terminal 524 includes terminal portions 527, 528.

The battery cell 60 has a rectangular-shaped housing 530 with electrical terminals 532, 534 extending from first and second ends, respectively, of the housing 530. The electrical terminal 532 includes terminal portions 535, 536. Further, the electrical terminal 534 includes terminal portions 537, 538.

The battery cell 62 has a rectangular-shaped housing 540 with electrical terminals 542, 544 extending from first and second ends, respectively, of the housing 540. The electrical terminal 542 includes terminal portions 545, 546. Further, the electrical terminal 544 includes terminal portions 547, 548.

Referring to FIGS. 13-16, the interconnect assembly 90 is adapted to be electrically coupled to the battery cells 40-62. The interconnect assembly 90 includes a plate portion 600, finger portions 620, 622, 624, 626, 628, 630, 632, voltage sense members 642, 644, 646, 648, 650, and electrical terminals 660, 662.

The plate portion 600 includes a first side 680 and a second side 682. Further, the plate portion 600 includes a first end 684 and a second end 686. In an exemplary embodiment, the plate portion 600 is substantially rectangular shaped. Further, in an exemplary embodiment, the plate portion 600 is constructed of plastic.

The finger portions 620-632 are coupled and extend from the first end 684 of the plate portion 600 and are spaced apart from one another. Further, the finger portions 620-632 extend substantially parallel to one another. Each of the finger portions 620-632 have a T-shaped cross-sectional profile along a plane extending through the finger portions 620-632 that is substantially parallel to the first end 684 of the plate portion 600. In an exemplary embodiment, the finger portions 620-632 are constructed of plastic.

Figure 16:
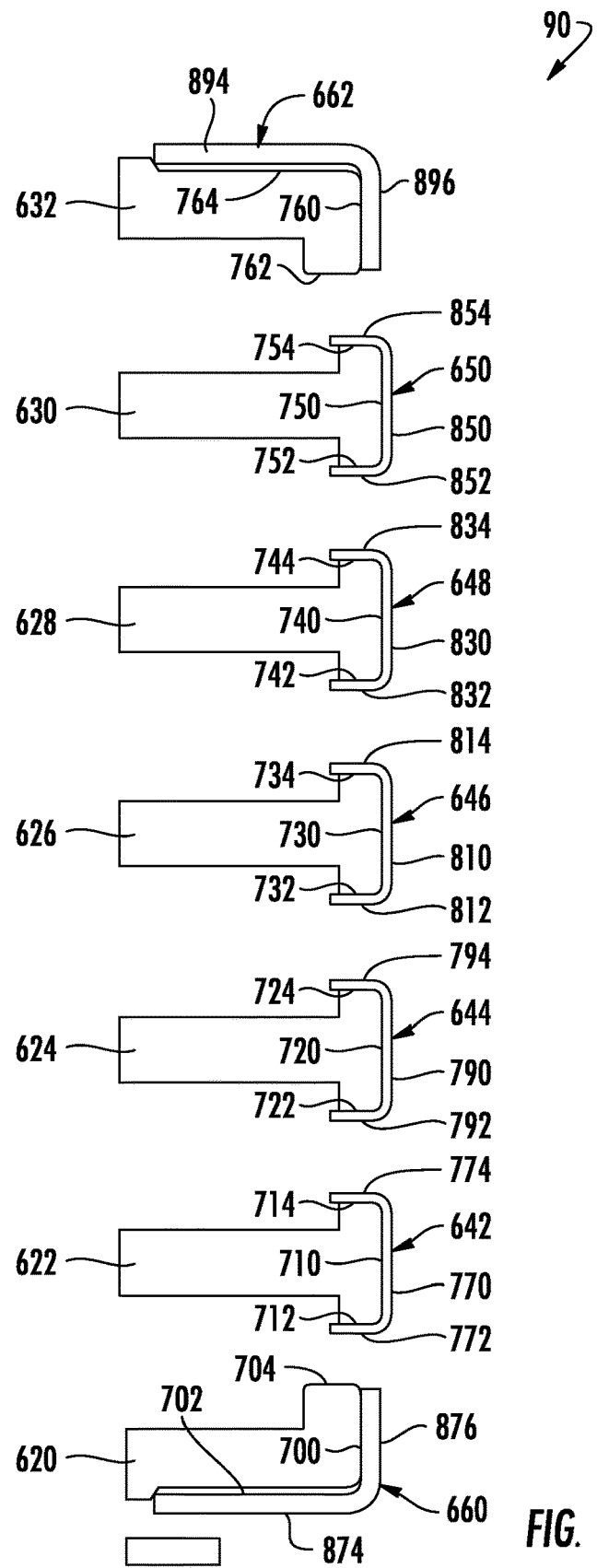
FIG. 16 is a cross-sectional view of a portion of the first interconnect assembly of FIG. 13 before electrical terminals are coupled to the first interconnect assembly.

Referring to FIG. 16, the finger portion 620 has a flat outer surface 700 and side surfaces 702, 704. The flat outer surface 700 is disposed between the first and second side surfaces 702, 704. Further, the first and second side surfaces 702, 704 extend substantially perpendicular to the flat outer surface 700 in a first direction.

The finger portion 622 has a flat outer surface 710 and side surfaces 712, 714. The flat outer surface 710 is disposed between the first and second side surfaces 712, 714. Further, the first and second side surfaces 712, 714 extend substantially perpendicular to the flat outer surface 710 in the first direction.

The finger portion 624 has a flat outer surface 720 and side surfaces 722, 724. The flat outer surface 720 is disposed between the first and second side surfaces 722, 724. Further, the first and second side surfaces 722, 724 extend substantially perpendicular to the flat outer surface 720 in the first direction.

The finger portion 626 has a flat outer surface 730 and side surfaces 732, 734. The flat outer surface 730 is disposed between the first and second side surfaces 732, 734. Further, the first and second side surfaces 732, 734 extend substantially perpendicular to the flat outer surface 730 in the first direction.

The finger portion 628 has a flat outer surface 740 and side surfaces 742, 744. The flat outer surface 740 is disposed between the first and second side surfaces 742, 744. Further, the first and second side surfaces 742, 744 extend substantially perpendicular to the flat outer surface 740 in the first direction.

The finger portion 630 has a flat outer surface 750 and side surfaces 752, 754. The flat outer surface 750 is disposed between the first and second side surfaces 752, 754. Further, the first and second side surfaces 752, 754 extend substantially perpendicular to the flat outer surface 750 in the first direction.

The finger portion 632 has a flat outer surface 760 and side surfaces 762, 764. The flat outer surface 760 is disposed between the first and second side surfaces 762, 764. Further, the first and second side surfaces 762, 764 extend substantially perpendicular to the flat outer surface 760 in the first direction.

Referring to FIGS. 13-18, the voltage sense members 642, 644, 646, 648, 650 are adapted to be electrically coupled to electrical terminals of the battery cells. In an exemplary embodiment, the voltage sense members 642-650 are constructed of steel. Of course, in an alternative embodiment, the voltage sense members 642-650 could be constructed of other metals such as copper or aluminum for example. The structure of the voltage sense members 642-650 are identical to one another.

Figure 17:
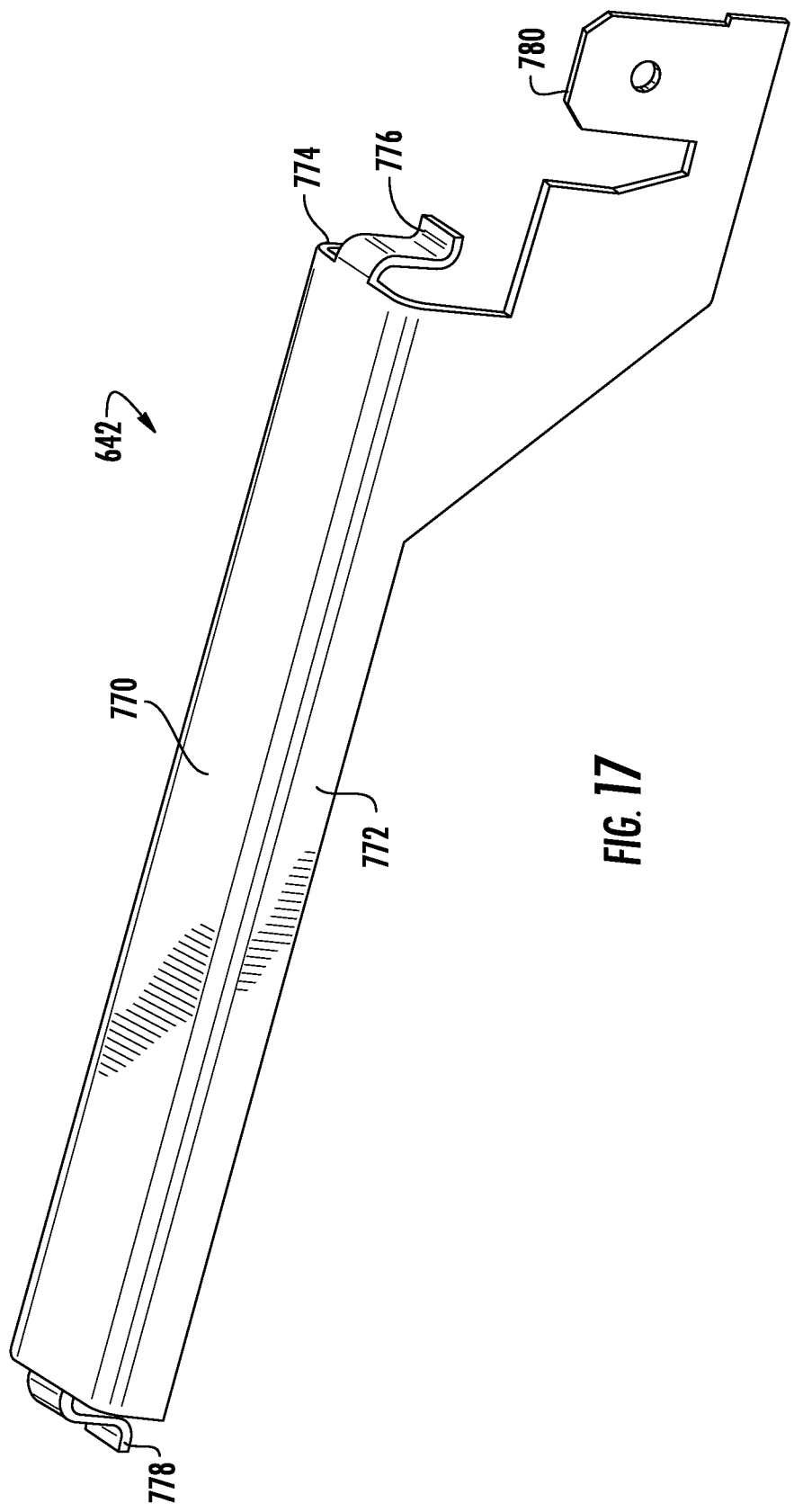
FIG. 17 is a schematic of a voltage sense member utilized in the battery module of FIG. 1.
Figure 18:
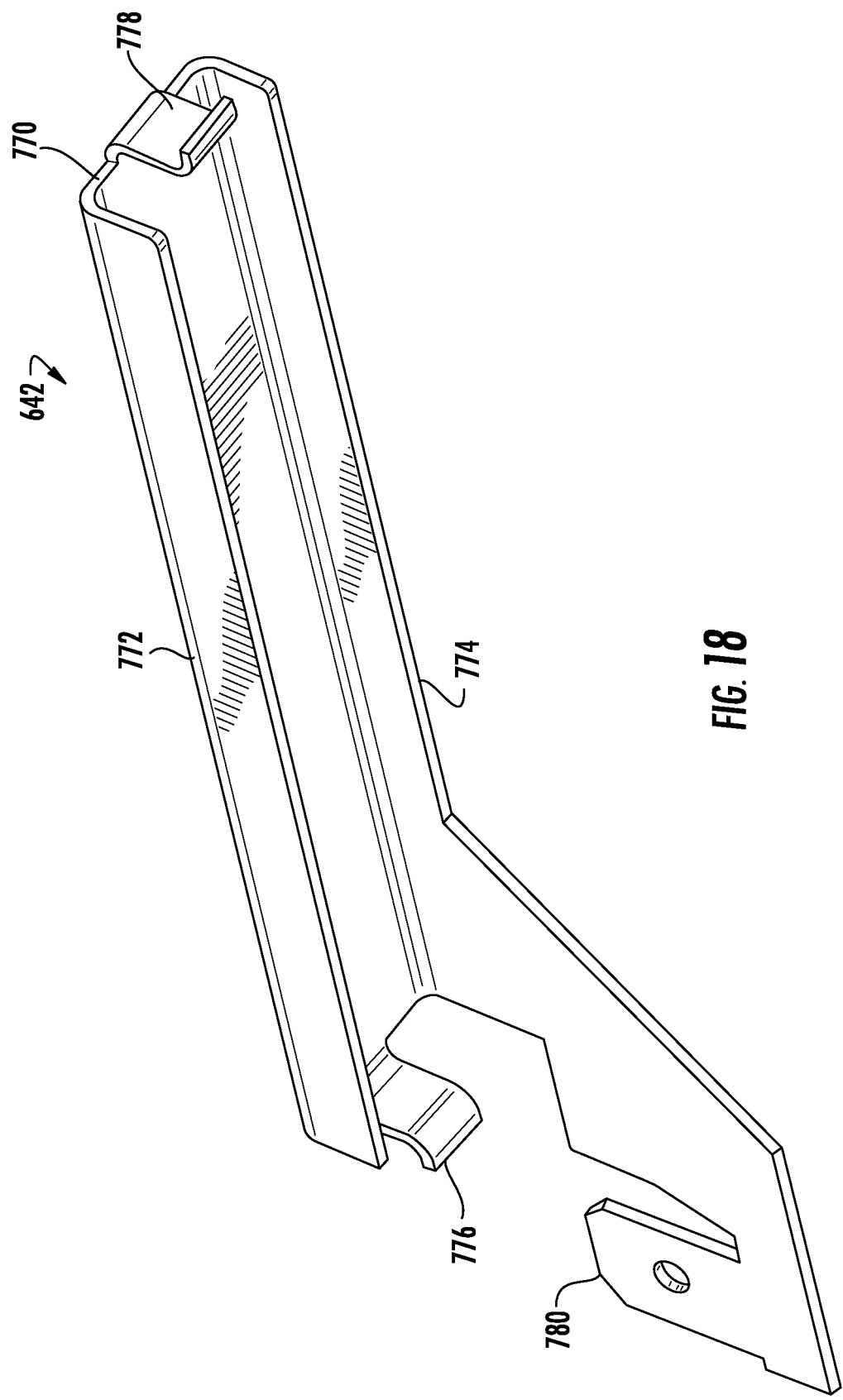
FIG. 18 is another schematic of the voltage sense member of FIG. 17.
Figure 19:
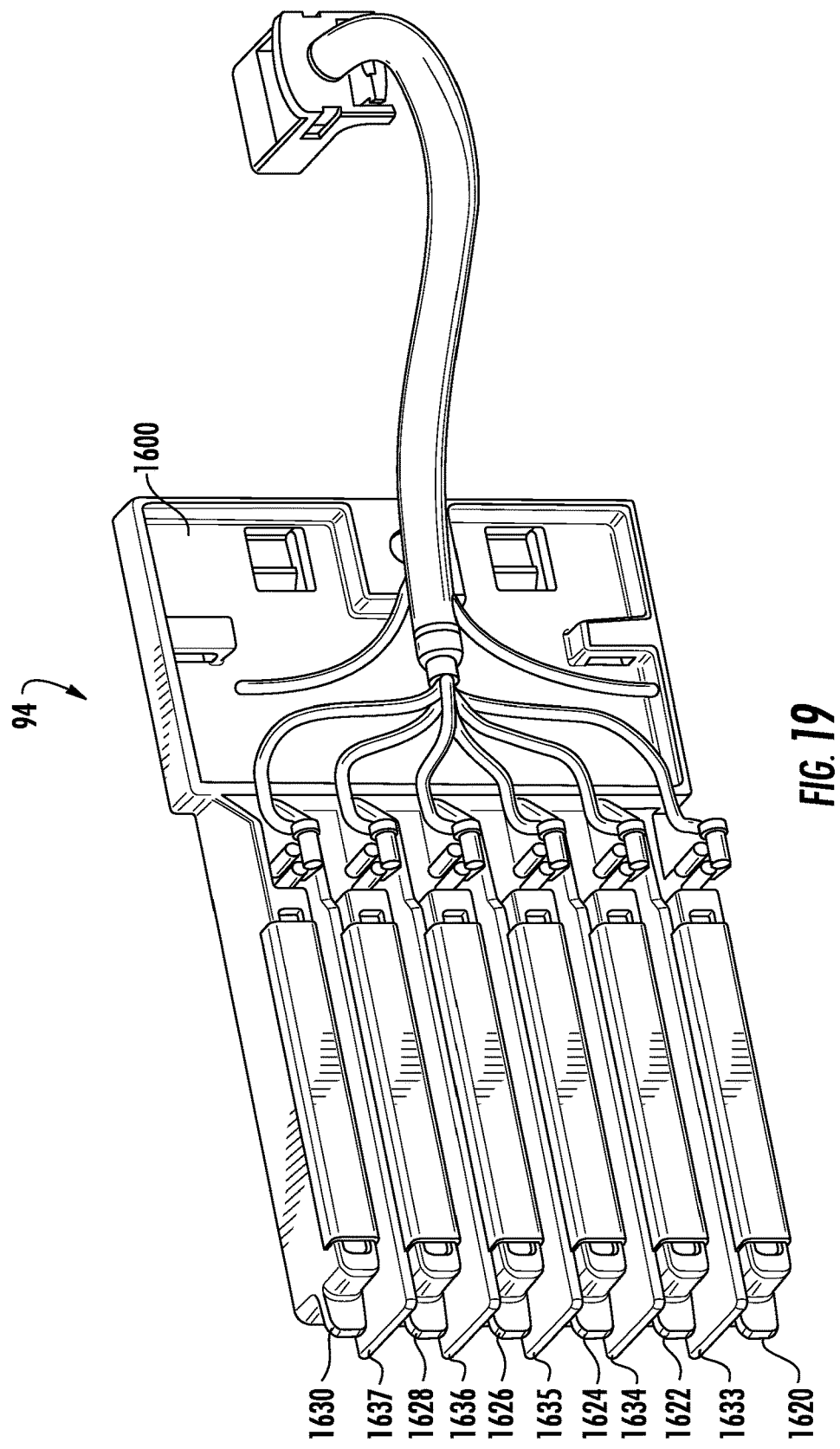
FIG. 19 is a schematic of a second interconnect assembly utilized in the battery module of FIG. 1.

Referring to FIGS. 6, 16 and 17, the voltage sense member 642 is coupled to the finger portion 622. The voltage sense member 642 has voltage sense walls 770, 772, 774 and coupler members 776, 778. The voltage sense walls 772, 774 are coupled to and extend from first and second ends, respectively, of the voltage sense wall 770. The voltage sense walls 772, 774 extend substantially perpendicular to the voltage sense wall 770. The voltage sense wall 770 is disposed directly on the flat outer surface 710 of the finger portion 622. The voltage sense walls 772, 774 are disposed directly on the side surfaces 712, 714, respectively, of the finger portion 622.

The voltage sense wall 772 defines an electrical tab connector 780 adapted to be coupled to a spade clip of the removable wire harness assembly 92.

The coupler members 776, 778 are coupled to and extend from first and second ends, respectively, of the voltage sense wall 770. The coupler members 776, 778 are adapted to be received in respective apertures in the finger portion 622 and to hold the voltage sense member 642 on the finger portion 622.

Referring to FIGS. 6 and 16, the electrical terminal 442 has the terminal portion 445 disposed directly on the voltage sense wall 772 of the voltage sense member 642, and the terminal portion 446 disposed directly on and coupled to the voltage sense wall 710 of the voltage sense member 642.

The electrical terminal 452 has the terminal portion 455 disposed directly on the voltage sense wall 774 of the voltage sense member 642, and the terminal portion 456 disposed directly on and coupled to the terminal portion 446 of the electrical terminal 442. The terminal portion 446 is sandwiched between the voltage sense wall 770 and the terminal portion 456.

Figure 14:
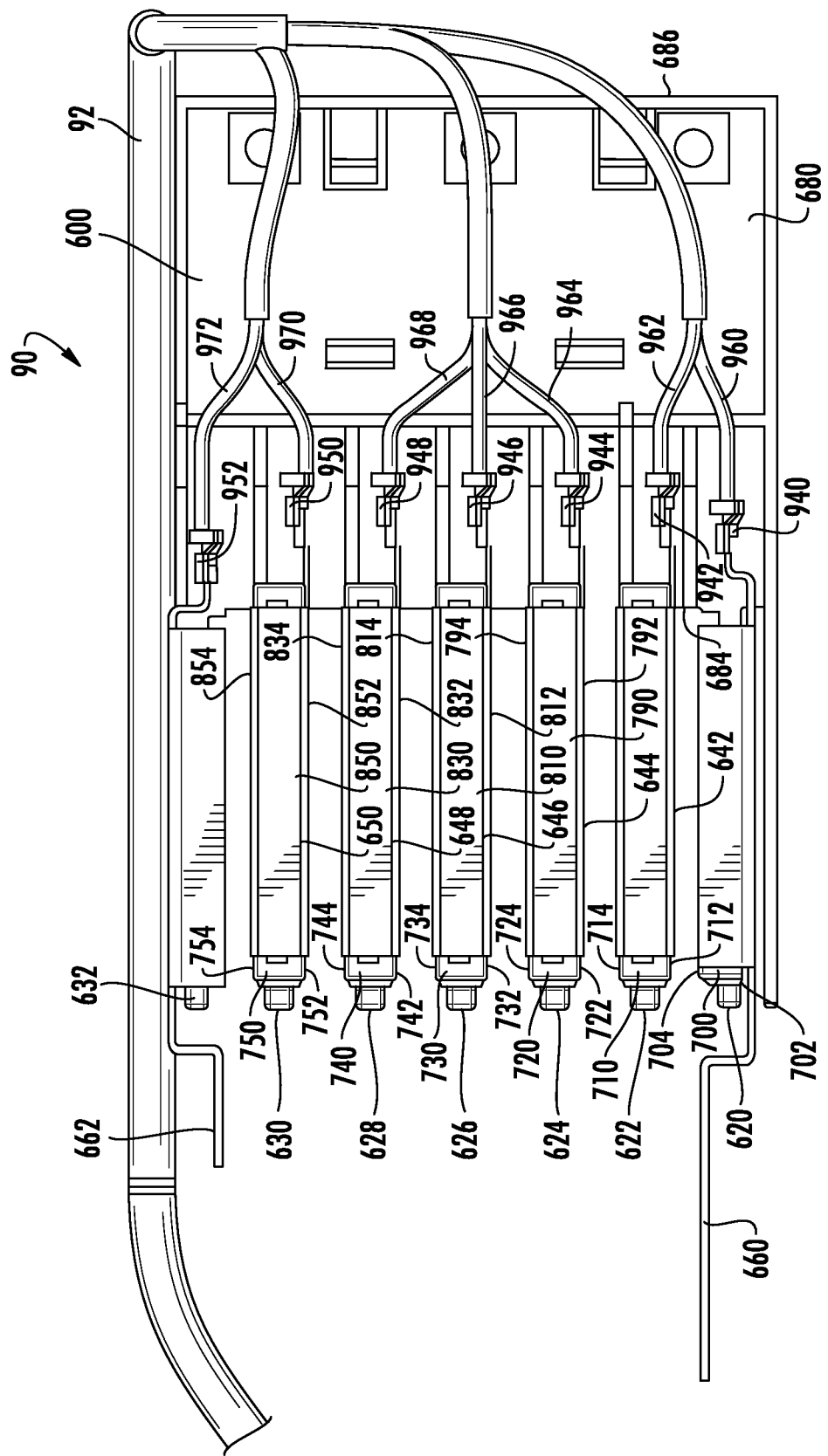
FIG. 14 is a top view of the first interconnect assembly of FIG. 13.
Figure 15:
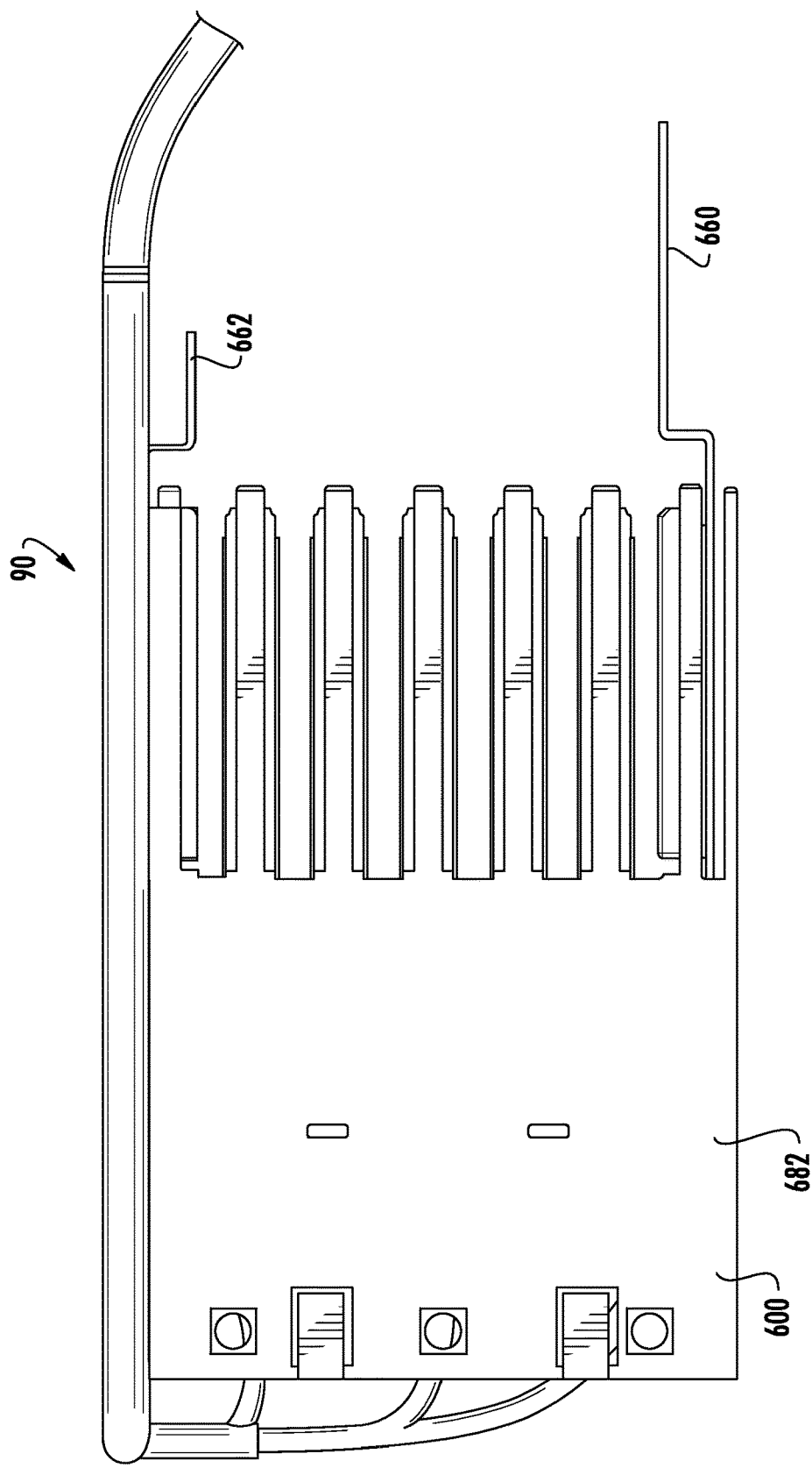
FIG. 15 is a bottom view of the first interconnect assembly of FIG. 13.

Referring to FIGS. 6, 14 and 16, the voltage sense member 644 is coupled to the finger portion 624. The voltage sense member 644 has voltage sense walls 790, 792, 794. The voltage sense walls 792, 794 are coupled to and extend from first and second ends, respectively, of the voltage sense wall 790. The voltage sense walls 792, 794 extend substantially perpendicular to the voltage sense wall 790. The voltage sense wall 790 is disposed directly on the flat outer surface 720 of the finger portion 624. The voltage sense walls 792, 794 are disposed directly on the side surfaces 722, 724, respectively, of the finger portion 624.

The electrical terminal 462 has the terminal portion 465 disposed directly on the voltage sense wall 792 of the voltage sense member 644, and the terminal portion 466 disposed directly on and coupled to the voltage sense wall 790 of the voltage sense member 644.

The electrical terminal 472 has the terminal portion 475 disposed directly on the voltage sense wall 794 of the voltage sense member 644, and the terminal portion 476 disposed directly on and coupled to the terminal portion 466 of the electrical terminal 462. The terminal portion 466 is sandwiched between the voltage sense wall 790 and the terminal portion 476.

The voltage sense member 646 is coupled to the finger portion 626. The voltage sense member 646 has voltage sense walls 810, 812, 814. The voltage sense walls 812, 814 are coupled to and extend from first and second ends, respectively, of the voltage sense wall 810. The voltage sense walls 812, 814 extend substantially perpendicular to the voltage sense wall 810. The voltage sense wall 810 is disposed directly on the flat outer surface 730 of the finger portion 626. The voltage sense walls 812, 814 are disposed directly on the side surfaces 732, 734, respectively, of the finger portion 626.

The electrical terminal 482 has the terminal portion 485 disposed directly on the voltage sense wall 812 of the voltage sense member 646, and the terminal portion 486 disposed directly on and coupled to the voltage sense wall 810 of the voltage sense member 646.

The electrical terminal 492 has the terminal portion 495 disposed directly on the voltage sense wall 814 of the voltage sense member 646, and the terminal portion 496 disposed directly on and coupled to the terminal portion 486 of the electrical terminal 482. The terminal portion 486 is sandwiched between the voltage sense wall 810 and the terminal portion 496.

The voltage sense member 648 is coupled to the finger portion 628. The voltage sense member 648 has voltage sense walls 830, 832, 834. The voltage sense walls 832, 834 are coupled to and extend from first and second ends, respectively, of the voltage sense wall 830. The voltage sense walls 832, 834 extend substantially perpendicular to the voltage sense wall 830. The voltage sense wall 830 is disposed directly on the flat outer surface 740 of the finger portion 628. The voltage sense walls 832, 834 are disposed directly on the side surfaces 742, 744, respectively, of the finger portion 628.

The electrical terminal 502 has the terminal portion 505 disposed directly on the voltage sense wall 832 of the voltage sense member 648, and the terminal portion 506 disposed directly on and coupled to the voltage sense wall 830 of the voltage sense member 648.

The electrical terminal 512 has the terminal portion 515 disposed directly on the voltage sense wall 834 of the voltage sense member 648, and the terminal portion 516 disposed directly on and coupled to the terminal portion 506 of the electrical terminal 502. The terminal portion 506 is sandwiched between the voltage sense wall 830 and the terminal portion 516.

The voltage sense member 650 is coupled to the finger portion 630. The voltage sense member 650 has voltage sense walls 850, 852, 854. The voltage sense walls 852, 854 are coupled to and extend from first and second ends, respectively, of the voltage sense wall 850. The voltage sense walls 852, 854 extend substantially perpendicular to the voltage sense wall 850. The voltage sense wall 850 is disposed directly on the flat outer surface 750 of the finger portion 630. The voltage sense walls 852, 854 are disposed directly on the side surfaces 752, 754, respectively, of the finger portion 630.

The electrical terminal 522 has the terminal portion 525 disposed directly on the voltage sense wall 852 of the voltage sense member 650, and the terminal portion 526 disposed directly on and coupled to the voltage sense wall 850 of the voltage sense member 650.

The electrical terminal 532 has the terminal portion 535 disposed directly on the voltage sense wall 854 of the voltage sense member 650, and the terminal portion 536 disposed directly on and coupled to the terminal portion 526 of the electrical terminal 522. The terminal portion 526 is sandwiched between the voltage sense wall 850 and the terminal portion 536.

Figure 13:
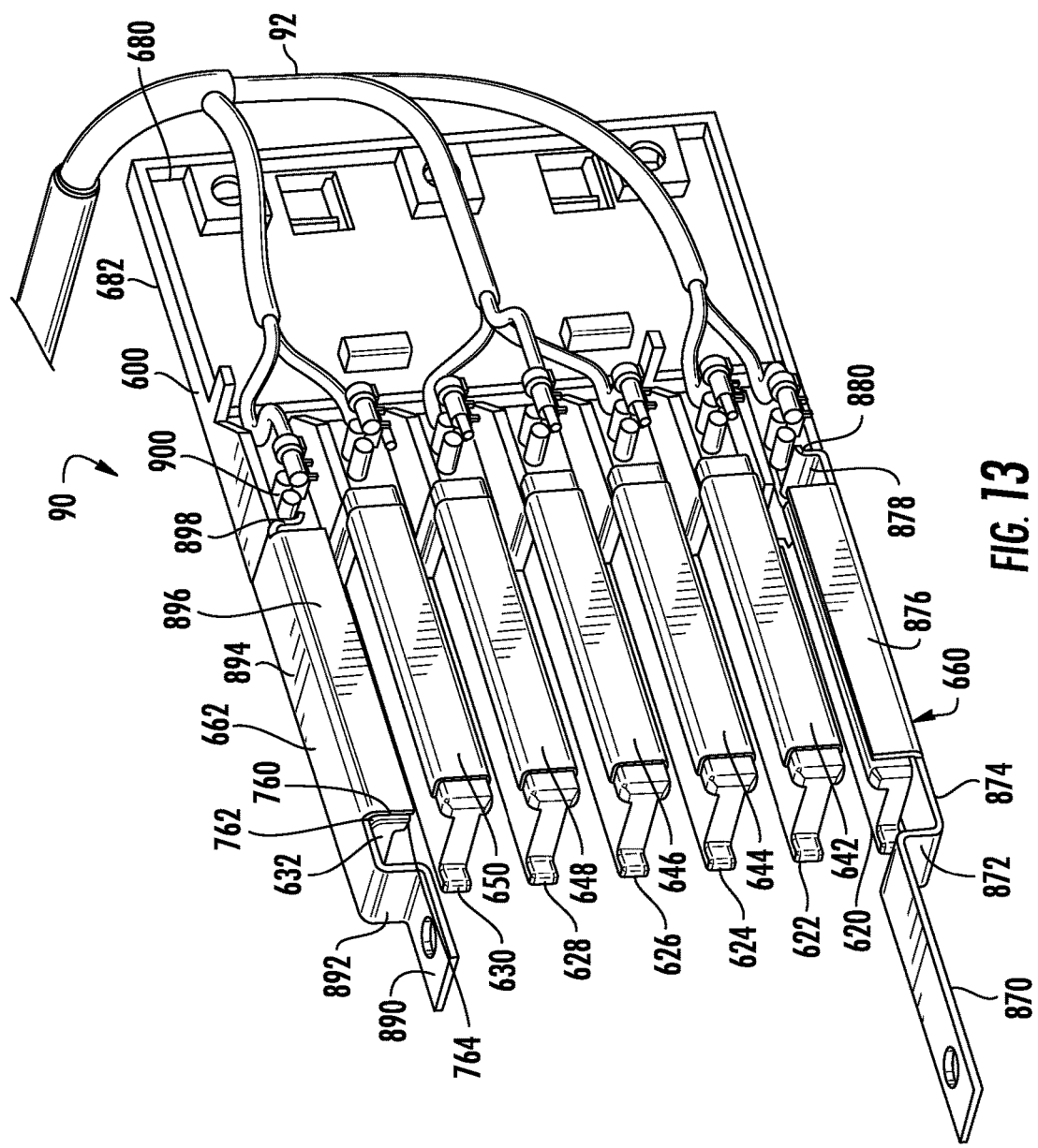
FIG. 13 is a schematic of a first interconnect assembly utilized in the battery module of FIG. 1.

Referring to FIGS. 6 and 13, the electrical terminal 660 is adapted to be coupled to the finger portion 620 of the interconnect assembly 90. The electrical terminal 660 includes terminal walls 870, 872, 874, 876, 878, 880, 882. The terminal wall 872 is coupled to and extends substantially perpendicular to the terminal walls 870, 874. The terminal wall 876 extends substantially perpendicular to the terminal wall 874. The terminal wall 880 is coupled to and extends substantially perpendicular to the terminal walls 874, 880. The terminal wall 880 defines an electrical tab connector that is configured to hold a spade clip of the removable wire harness assembly 92 thereon. The terminal wall 876 is disposed on a coupled to the flat outer surface 700 of the finger portion 620. In an exemplary embodiment, the electrical terminal 660 is constructed of steel. However, in an alternative embodiment, the electrical terminal 660 could be constructed of other metals such as aluminum or copper for example.

The electrical terminal 662 is adapted to be coupled to the finger portion 632 of the interconnect assembly 90. The electrical terminal 662 includes terminal walls 890, 892, 894, 896, 898, 890. The terminal wall 892 is coupled to and extends substantially perpendicular to the terminal walls 890, 894. The terminal wall 896 extends substantially perpendicular to the terminal wall 894. The terminal wall 898 is coupled to and extends substantially perpendicular to the terminal walls 894, 900. The terminal wall 900 defines an electrical tab connector that is configured to hold a spade clip of the removable wire harness assembly 92 thereon. The terminal wall 896 is disposed on a coupled to the flat outer surface 760 of the finger portion 632. In an exemplary embodiment, the electrical terminal 662 is constructed of steel. However, in an alternative embodiment, the electrical terminal 662 could be constructed of other metals such as aluminum or copper for example.

Figure 2:
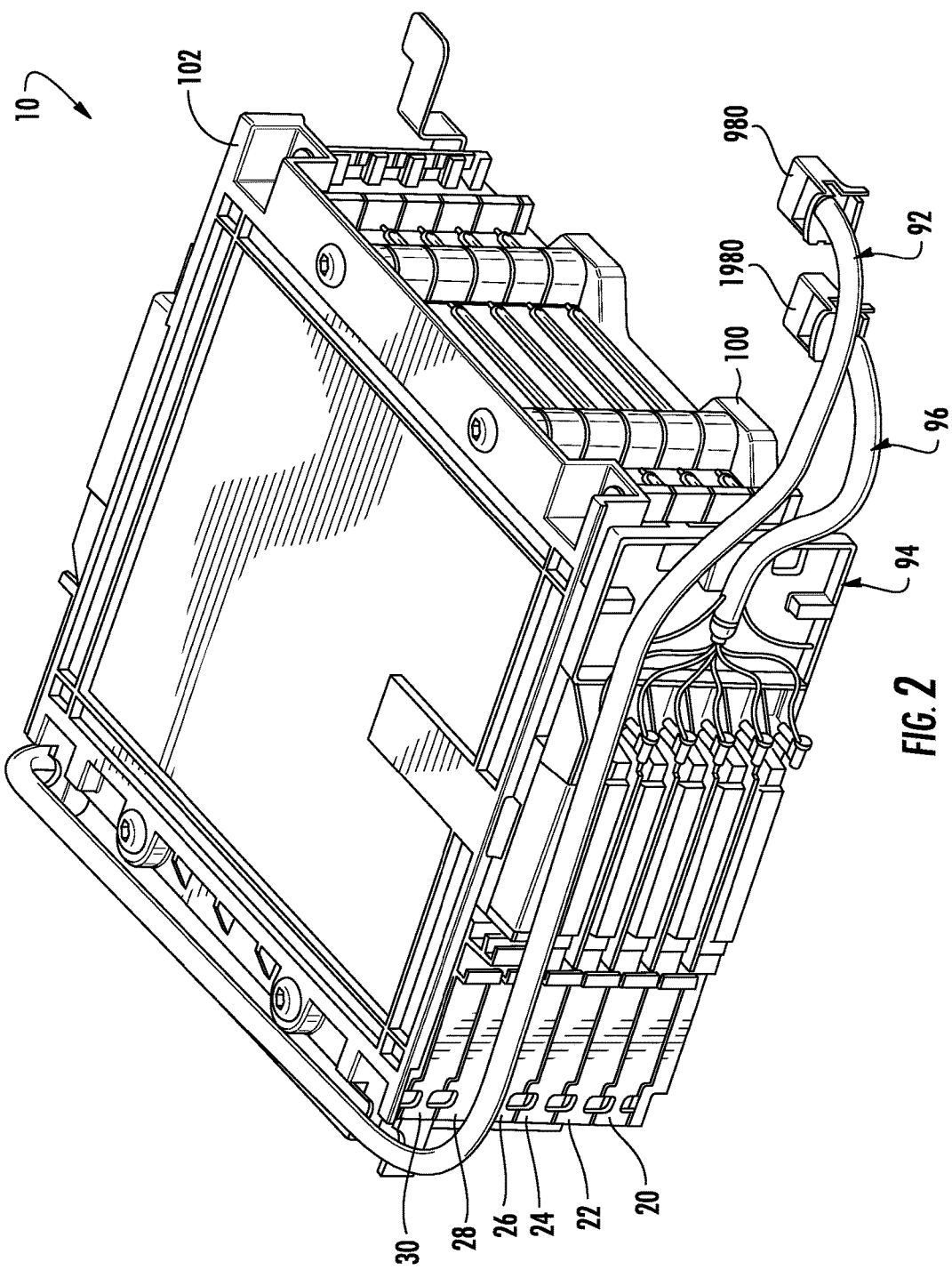
FIG. 2 is another schematic of the battery module of FIG. 1.
Figure 3:
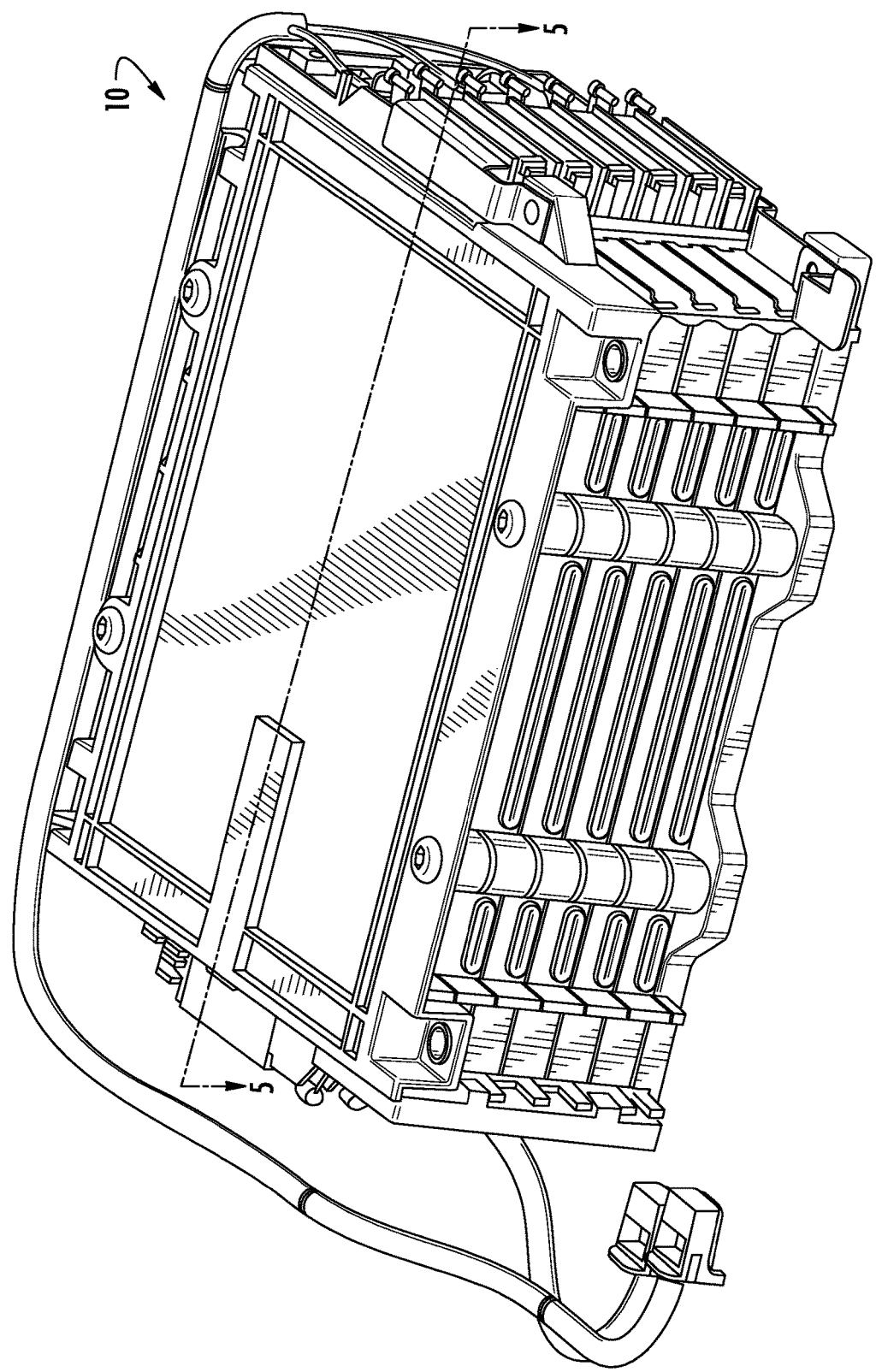
FIG. 3 is another schematic of the battery module of FIG. 1.
Figure 4:
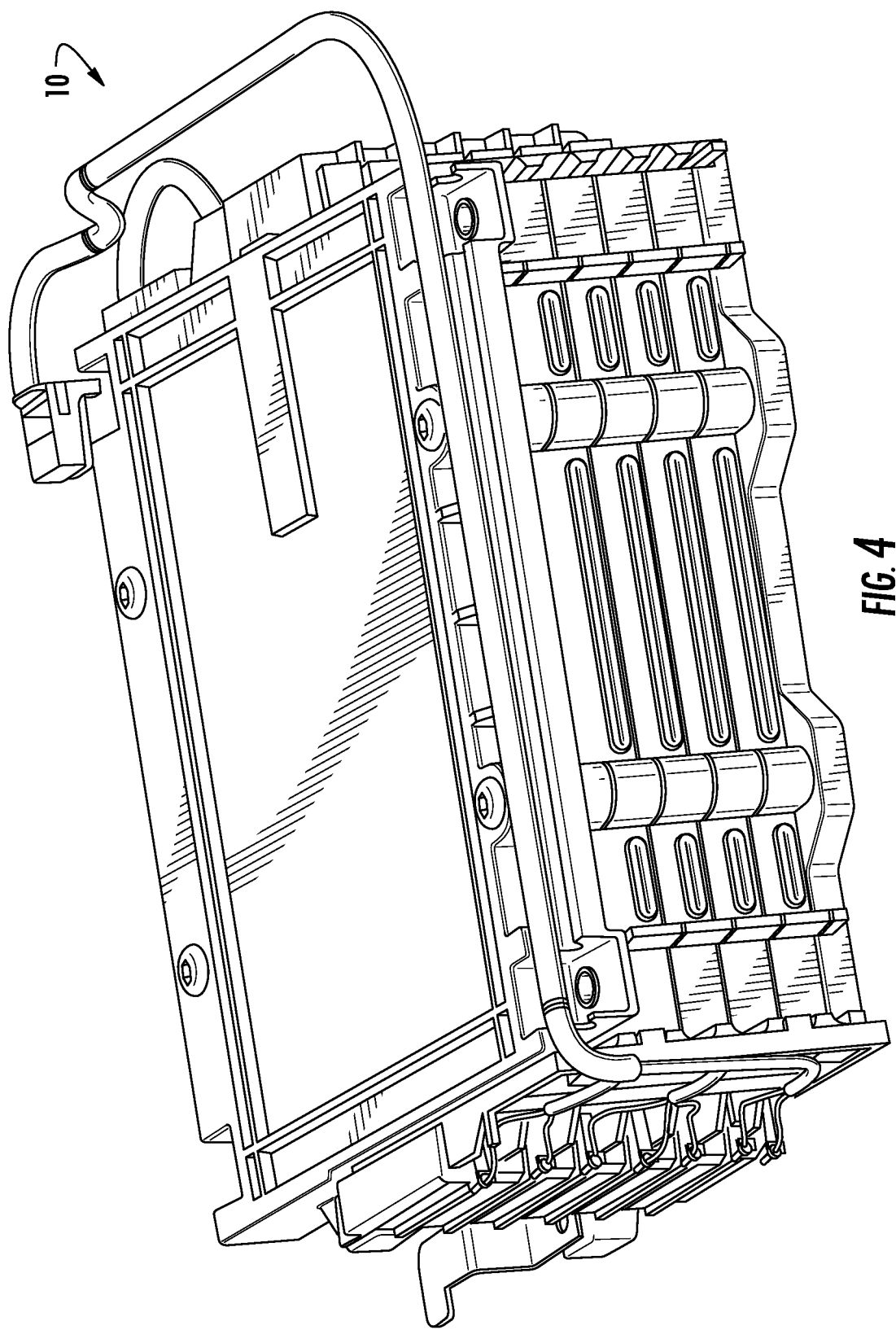
FIG. 4 is another schematic of the battery module of FIG. 1.

Referring to FIGS. 2, 13 and 14, the removable wire harness assembly 92 is provided to route voltages from the voltage sense members 642, 644, 646, 648, 650 and the electrical terminals 660, 662 to a battery management system. The removable wire harness assembly 92 includes spade clips 940, 942, 944, 946, 948, 950, 952, electrical cables 960, 962, 964, 966, 968, 970, 972, and an electrical connector 980.

The spade clip 940 is coupled to the electrical cable 960 and is further removably physically and electrically coupled to the electrical connector 660. The electrical cable 960 is further coupled to the electrical connector 980.

The spade clip 942 is coupled to the electrical cable 962 and is further removably physically and electrically coupled to an electrical tab member of the voltage sense member 642. The electrical cable 962 is further coupled to the electrical connector 980.

The spade clip 944 is coupled to the electrical cable 964 and is further removably physically and electrically coupled to an electrical tab member of the voltage sense member 644. The electrical cable 964 is further coupled to the electrical connector 980.

The spade clip 946 is coupled to the electrical cable 966 and is further removably physically and electrically coupled to an electrical tab member of the voltage sense member 646. The electrical cable 966 is further coupled to the electrical connector 980.

The spade clip 948 is coupled to the electrical cable 968 and is further removably physically and electrically coupled to an electrical tab member of the voltage sense member 648. The electrical cable 968 is further coupled to the electrical connector 980.

The spade clip 950 is coupled to the electrical cable 970 and is further removably physically and electrically coupled to an electrical tab member of the voltage sense member 650. The electrical cable 970 is further coupled to the electrical connector 980.

The spade clip 952 is coupled to the electrical cable 972 and is further removably physically and electrically coupled to the electrical connector 662. The electrical cable 972 is further coupled to the electrical connector 980.

Referring to FIGS. 5 and 19-22, the interconnect assembly 94 is adapted to be electrically coupled to the battery cells 40-62. The interconnect assembly 94 includes a plate portion 1600, finger portions 1620, 1622, 1624, 1626, 1628, 1630, blade portions 1633, 1634, 1635, 1636, 1637, and voltage sense members 1640, 1642, 1644, 1646, 1648, 1650.

The plate portion 1600 includes a first side 1680 and a second side 1682. Further, the plate portion 1600 includes a first end 1684 and a second end 1686. In an exemplary embodiment, the plate portion 1600 is substantially rectangular shaped. Further, in an exemplary embodiment, the plate portion 1600 is constructed of plastic.

The finger portions 1620-1630 are coupled and extend from the first end 1684 of the plate portion 1600 and are spaced apart from one another. Further, the finger portions 1620-1630 extend substantially parallel to one another. Each of the finger portions 1620-1630 have a T-shaped cross-sectional profile along a plane extending through the finger portions 1620-1630 that is substantially parallel to the first end 1684 of the plate portion 1600. In an exemplary embodiment, the finger portions 1620-1630 are constructed of plastic.

Figure 22:
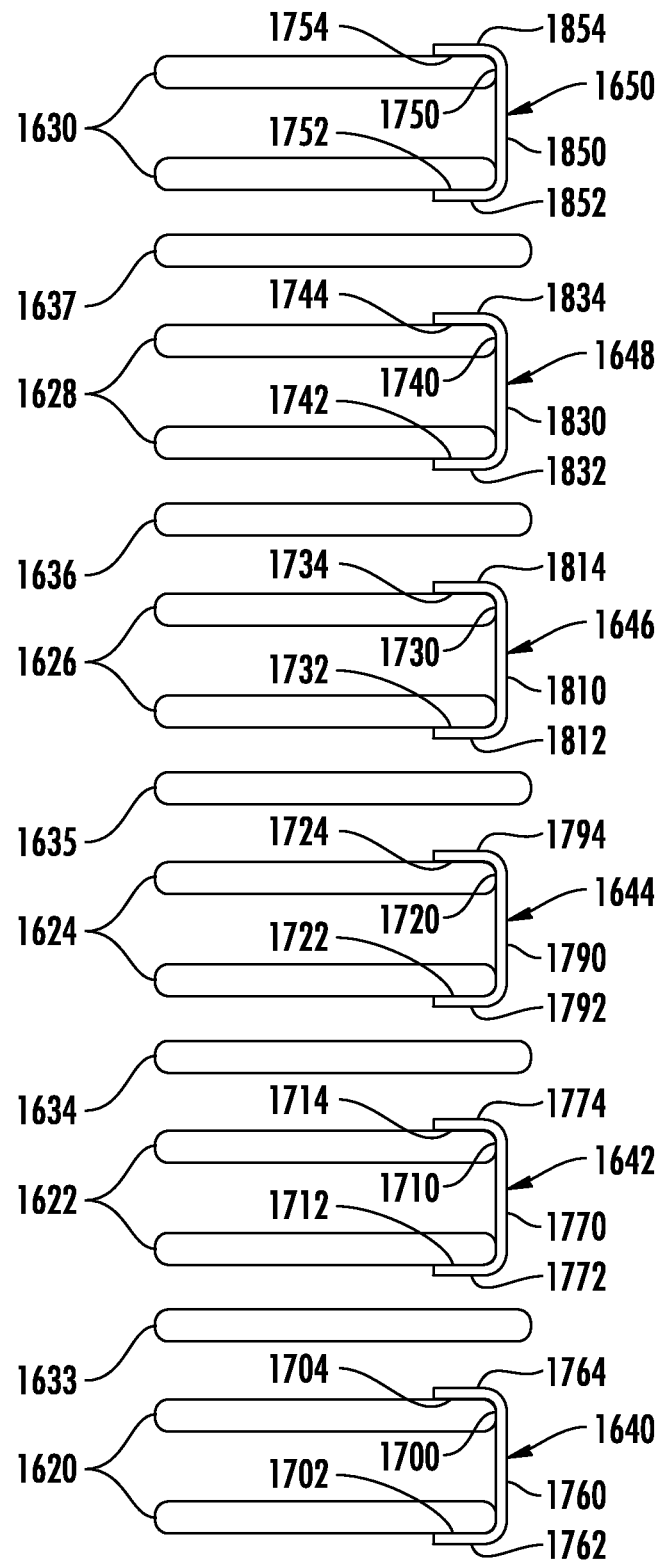
FIG. 22 is a cross-sectional view of a portion of the second interconnect assembly of FIG. 19 before electrical terminals are coupled to the second interconnect assembly.
Figure 23:
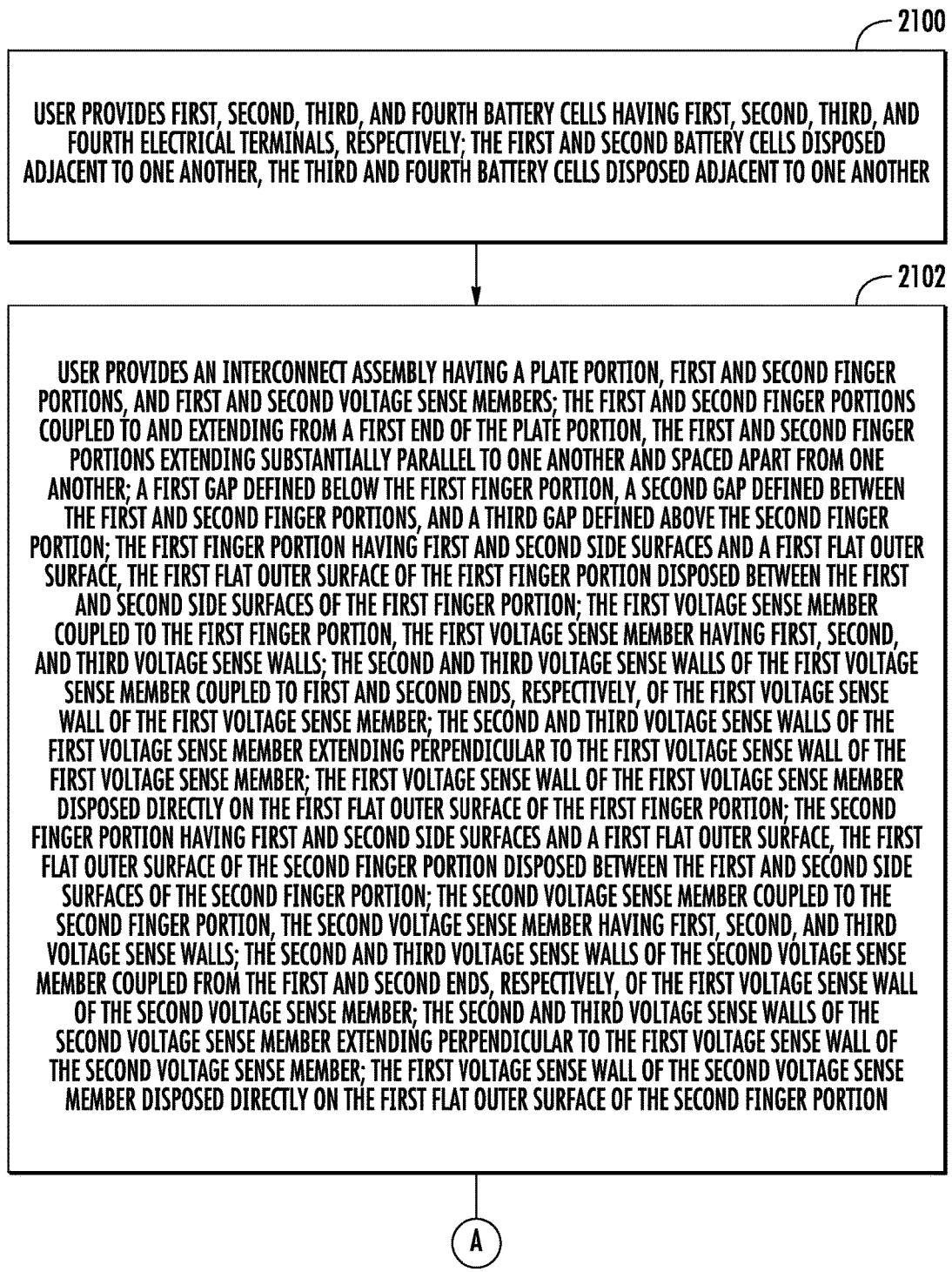
FIGS. 23-25 are flowcharts of coupling electrical terminals of battery cells to the first interconnect assembly of FIG. 13 in accordance with another exemplary embodiment.
Figure 24:
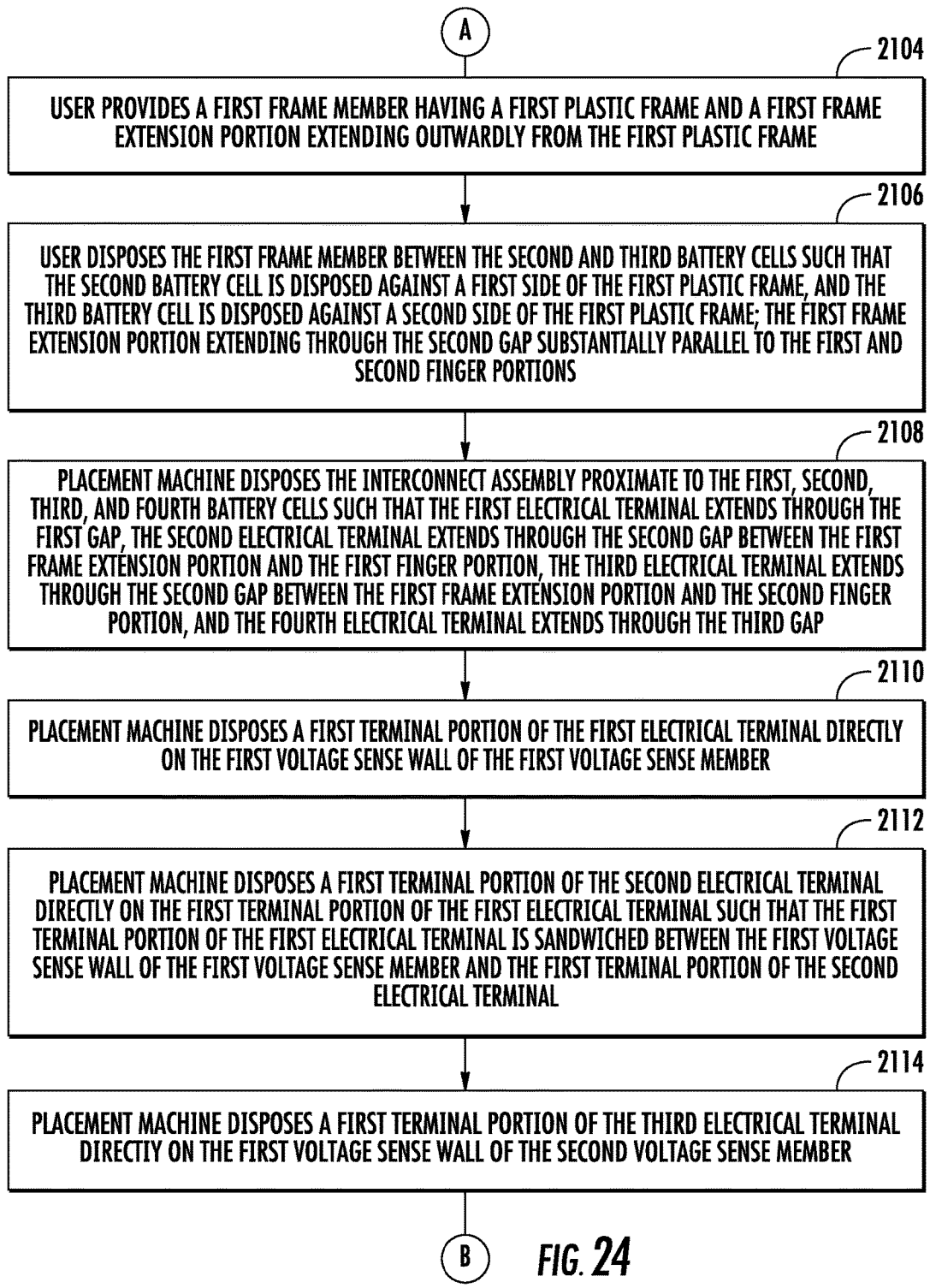
Figure 25:
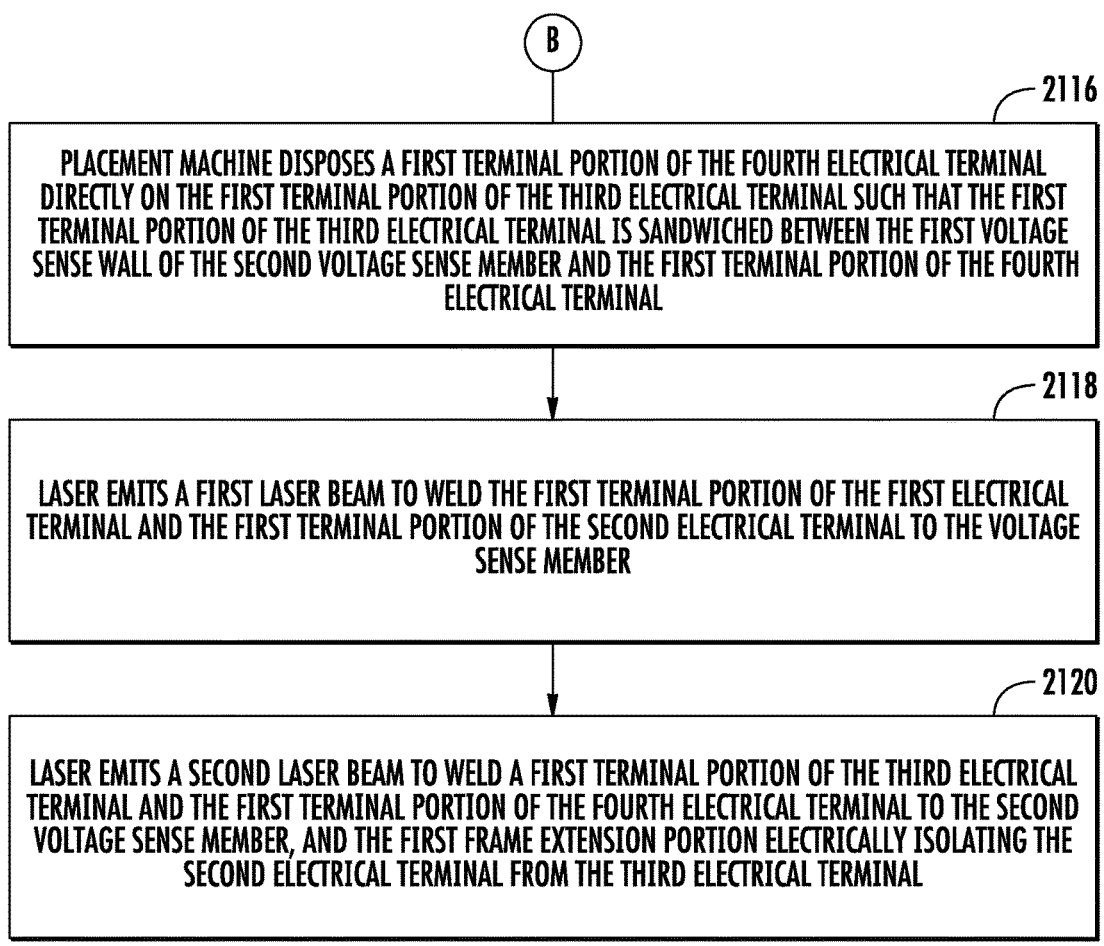
Figure 26:
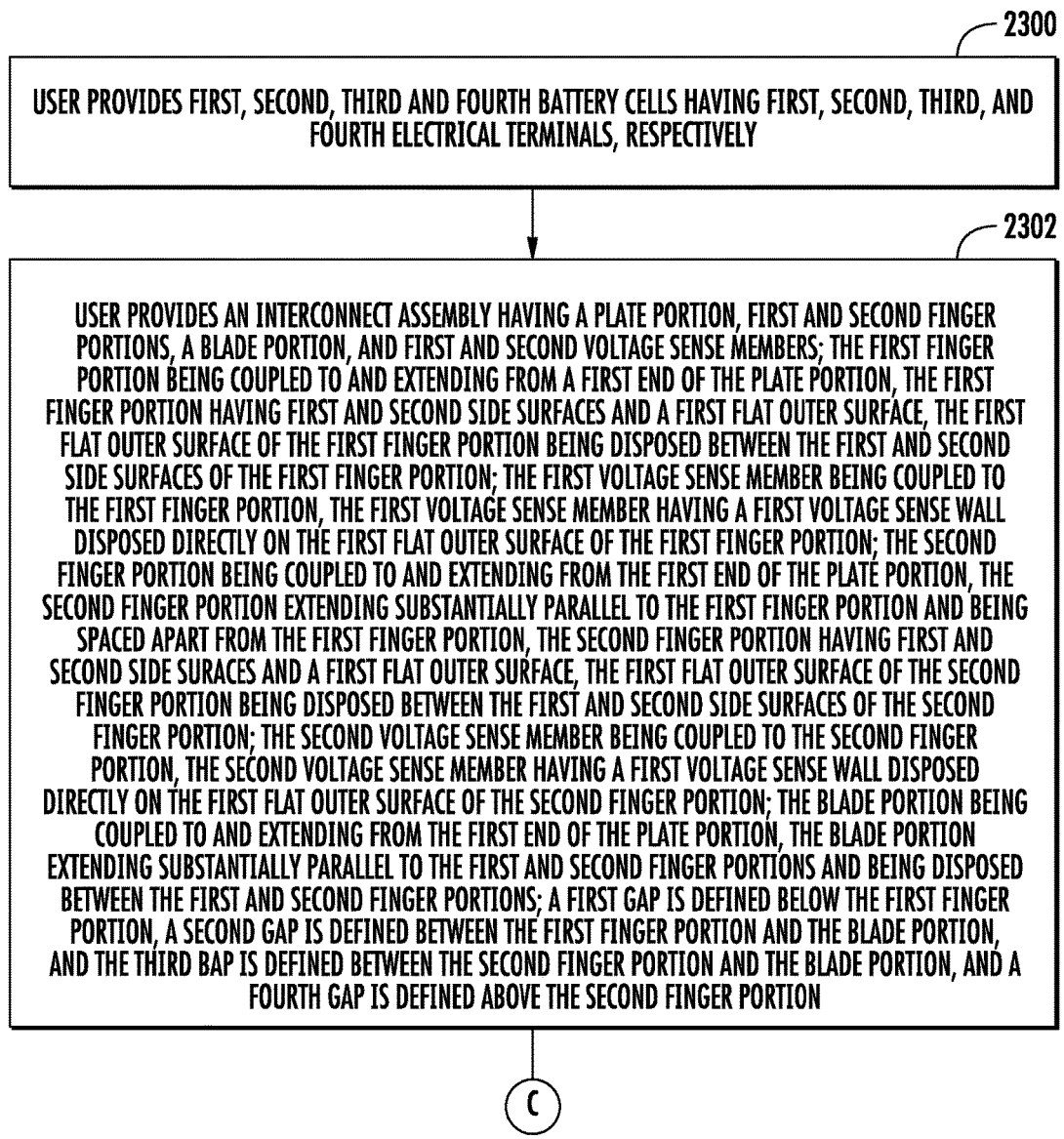
FIGS. 26-28 are flowcharts of a method of coupling electrical terminals of battery cells to the second interconnect assembly of FIG. 19 in accordance with another exemplary embodiment.
Figure 27:
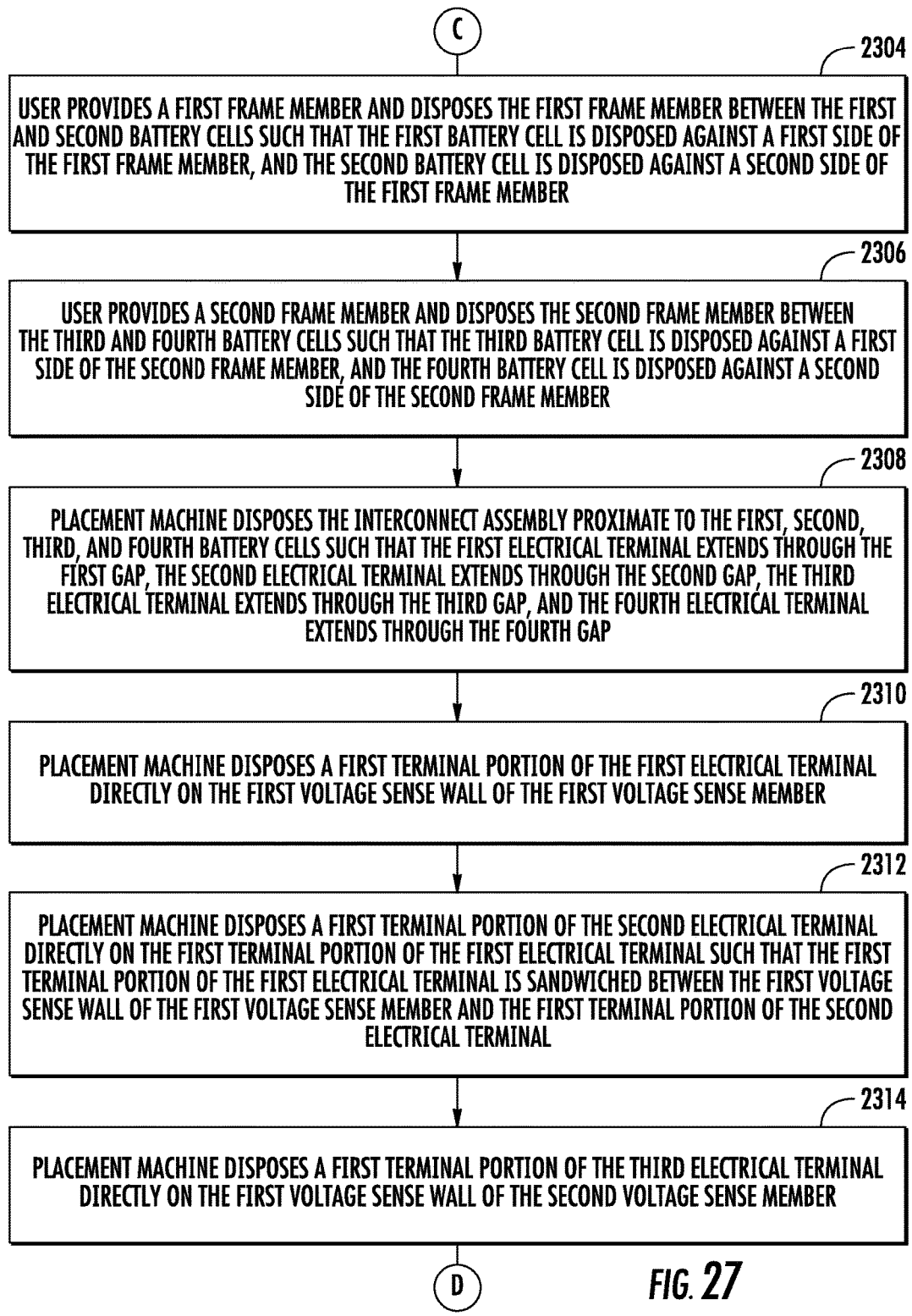
Figure 28:
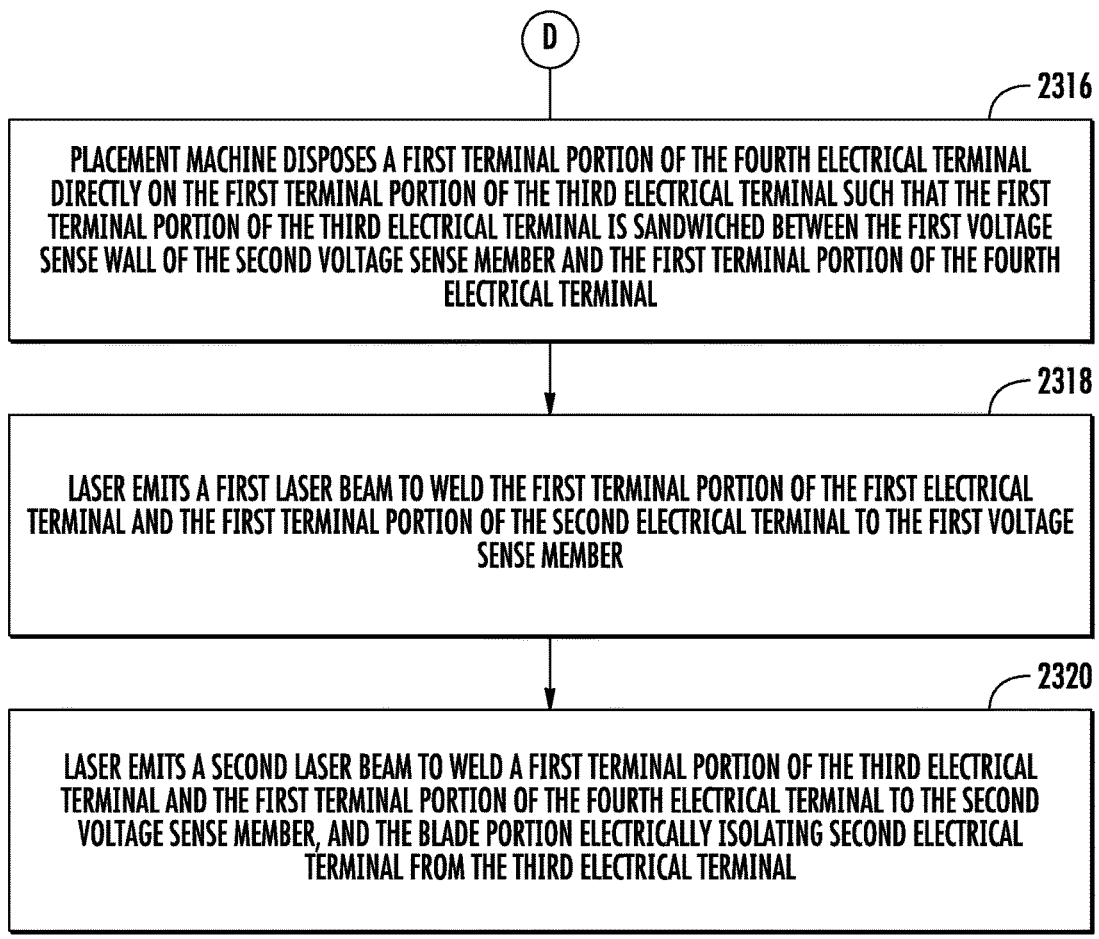

Referring to FIG. 22, the finger portion 1620 has a flat outer surface 1700 and side surfaces 1702, 1704. The flat outer surface 1700 is disposed between the first and second side surfaces 1702, 1704. Further, the first and second side surfaces 1702, 1704 extend substantially perpendicular to the flat outer surface 1700 in a second direction.

The finger portion 1622 has a flat outer surface 1710 and side surfaces 1712, 1714. The flat outer surface 1710 is disposed between the first and second side surfaces 1712, 1714. Further, the first and second side surfaces 1712, 1714 extend substantially perpendicular to the flat outer surface 1710 in the second direction.

The finger portion 1624 has a flat outer surface 1720 and side surfaces 1722, 1724. The flat outer surface 1720 is disposed between the first and second side surfaces 1722, 1724. Further, the first and second side surfaces 1722, 1724 extend substantially perpendicular to the flat outer surface 1720 in the second direction.

The finger portion 1626 has a flat outer surface 1730 and side surfaces 1732, 1734. The flat outer surface 1730 is disposed between the first and second side surfaces 1732, 1734. Further, the first and second side surfaces 1732, 1734 extend substantially perpendicular to the flat outer surface 1730 in the second direction.

The finger portion 1628 has a flat outer surface 1740 and side surfaces 1742, 1744. The flat outer surface 1740 is disposed between the first and second side surfaces 1742, 1744. Further, the first and second side surfaces 1742, 1744 extend substantially perpendicular to the flat outer surface 1740 in the second direction.

The finger portion 1630 has a flat outer surface 1750 and side surfaces 1752, 1754. The flat outer surface 1750 is disposed between the first and second side surfaces 1752, 1754. Further, the first and second side surfaces 1752, 1754 extend substantially perpendicular to the flat outer surface 1750 in the second direction.

Figure 20:
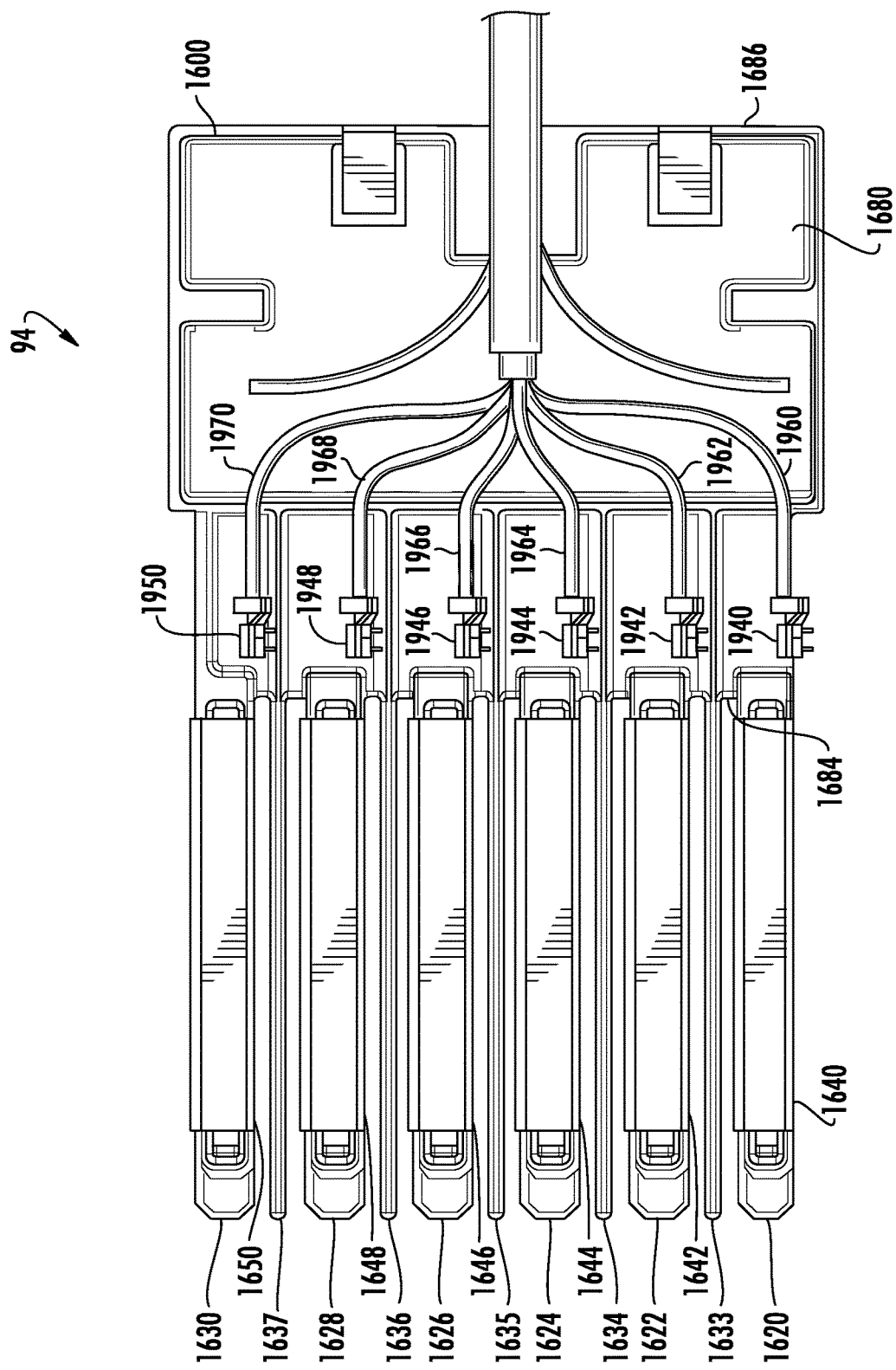
FIG. 20 is a top view of the second interconnect assembly of FIG. 19.
Figure 21:
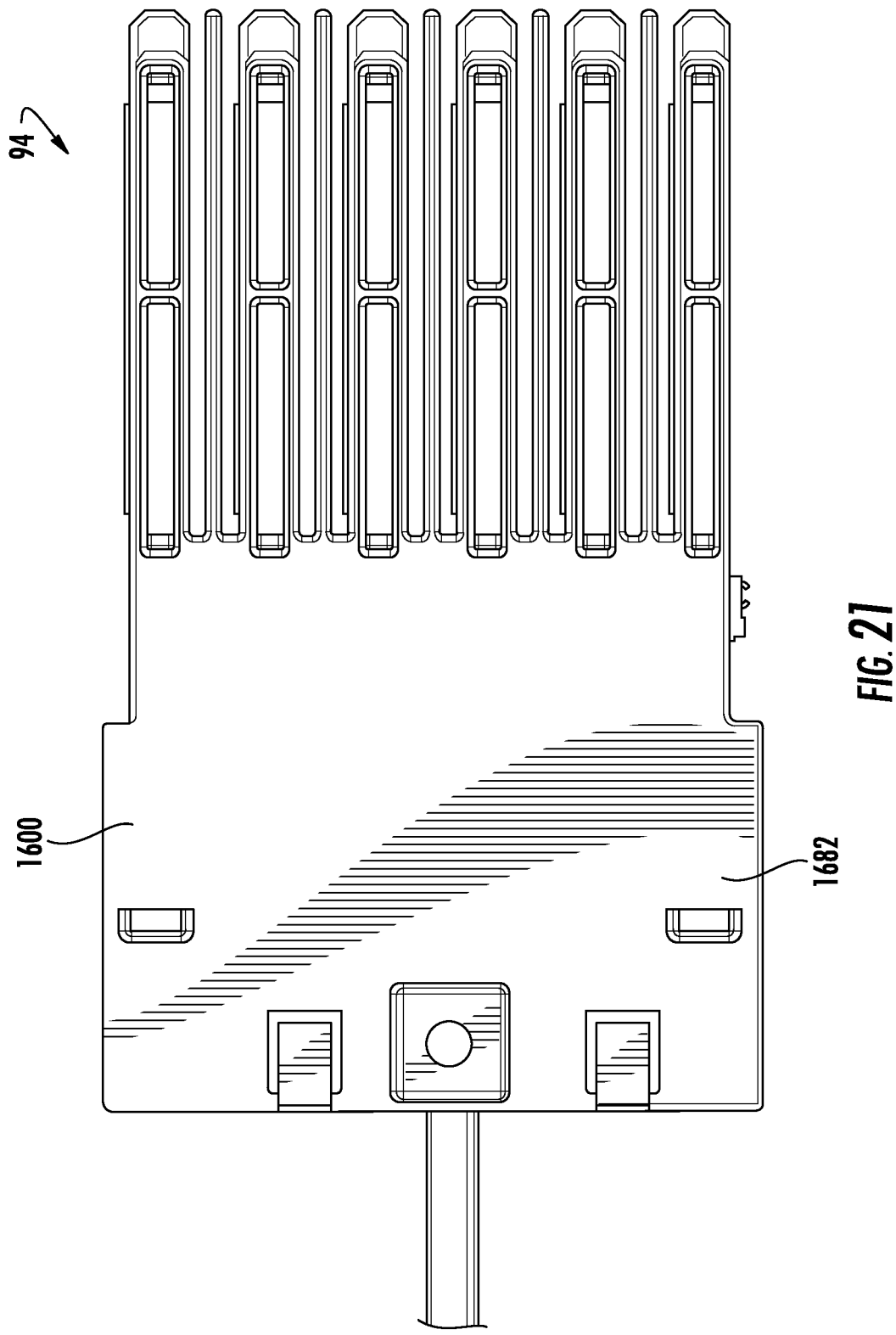
FIG. 21 is a bottom view of the second interconnect assembly of FIG. 19.

Referring to FIGS. 7, 20 and 22, the blade portions 1633-1637 will now be described. In an exemplary embodiment, the blade portions 1633-1637 are constructed of plastic. The blade portion 1633 is coupled to and extends from the first end 1684 of the plate portion 1600. The blade portion 1633 extends substantially parallel to the finger portions 1620, 1622 and is disposed between the finger portions 1620, 1622 such that a gap is defined between the finger portion 1620 and the blade portion 1633, and another gap is defined between the finger portion 1622 and the blade portion 1633. A length of the blade portion 1633 is greater than a length of each of the finger portions 1620, 1622. Further, a length of the blade portion 1633 is greater than a length of each of the voltage sense members 1640, 1642.

The blade portion 1634 is coupled to and extends from the first end 1684 of the plate portion 1600. The blade portion 1634 extends substantially parallel to the finger portions 1622, 1624 and is disposed between the finger portions 1622, 1624 such that a gap is defined between the finger portion 1622 and the blade portion 1634, and another gap is defined between the finger portion 1624 and the blade portion 1634. A length of the blade portion 1634 is greater than a length of each of the finger portions 1622, 1624. Further, a length of the blade portion 1634 is greater than a length of each of the voltage sense members 1642, 1644.

The blade portion 1635 is coupled to and extends from the first end 1684 of the plate portion 1600. The blade portion 1635 extends substantially parallel to the finger portions 1624, 1626 and is disposed between the finger portions 1624, 1626 such that a gap is defined between the finger portion 1624 and the blade portion 1635, and another gap is defined between the finger portion 1626 and the blade portion 1635. A length of the blade portion 1635 is greater than a length of each of the finger portions 1624, 1626. Further, a length of the blade portion 1635 is greater than a length of each of the voltage sense members 1644, 1646.

The blade portion 1636 is coupled to and extends from the first end 1684 of the plate portion 1600. The blade portion 1636 extends substantially parallel to the finger portions 1626, 1628 and is disposed between the finger portions 1626, 1628 such that a gap is defined between the finger portion 1626 and the blade portion 1636, and another gap is defined between the finger portion 1628 and the blade portion 1636. A length of the blade portion 1636 is greater than a length of each of the finger portions 1626, 1628. Further, a length of the blade portion 1636 is greater than a length of each of the voltage sense members 1646, 1648.

The blade portion 1637 is coupled to and extends from the first end 1684 of the plate portion 1600. The blade portion 1637 extends substantially parallel to the finger portions 1628, 1630 and is disposed between the finger portions 1628, 1630 such that a gap is defined between the finger portion 1628 and the blade portion 1637, and another gap is defined between the finger portion 1630 and the blade portion 1637. A length of the blade portion 1637 is greater than a length of each of the finger portions 1628, 1630. Further, a length of the blade portion 1637 is greater than a length of each of the voltage sense members 1648, 1650.

Referring to FIGS. 7 and 22, the voltage sense members 1640, 1642, 1644, 1646, 1648, 1650 are adapted to be electrically coupled to electrical terminals of the battery cells. In an exemplary embodiment, the voltage sense members 1640-1650 are constructed of steel. Of course, in an alternative embodiment, the voltage sense members 1640-1650 could be constructed of other materials such as copper or aluminum for example. The structure of the voltage sense members 1640-1650 are identical to one another and have a structure identical to the voltage sense member 642 discussed above.

The voltage sense member 1640 is coupled to the finger portion 1620. The voltage sense member 1640 has voltage sense walls 1760, 1762, 1764. The voltage sense walls 1762, 1764 are coupled to and extend from first and second ends, respectively, of the voltage sense wall 1760. The voltage sense walls 1762, 1764 extend substantially perpendicular to the voltage sense wall 1760. The voltage sense wall 1760 is disposed directly on the flat outer surface 1700 of the finger portion 1620. The voltage sense walls 1762, 1764 are disposed directly on the side surfaces 1702, 1704, respectively, of the finger portion 1620.

The electrical terminal 434 has the terminal portion 437 disposed directly on the voltage sense wall 1762 of the voltage sense member 1640, and the terminal portion 438 disposed directly on and coupled to the voltage sense wall 1760 of the voltage sense member 1640.

The electrical terminal 444 has the terminal portion 447 disposed directly on the voltage sense wall 1764 of the voltage sense member 1640, and the terminal portion 448 disposed directly on and coupled to the terminal portion 438 of the electrical terminal 434. The terminal portion 438 is sandwiched between the voltage sense wall 1760 and the terminal portion 448.

The voltage sense member 1642 is coupled to the finger portion 1622. The voltage sense member 1642 has voltage sense walls 1770, 1772, 1774. The voltage sense walls 1772, 1774 are coupled to and extend from first and second ends, respectively, of the voltage sense wall 1770. The voltage sense walls 1772, 1774 extend substantially perpendicular to the voltage sense wall 1770. The voltage sense wall 1770 is disposed directly on the flat outer surface 1710 of the finger portion 1622. The voltage sense walls 1772, 1774 are disposed directly on the side surfaces 1712, 1714, respectively, of the finger portion 1622.

The electrical terminal 454 has the terminal portion 457 disposed directly on the voltage sense wall 1772 of the voltage sense member 1622, and the terminal portion 458 disposed directly on and coupled to the voltage sense wall 1770 of the voltage sense member 1642.

The electrical terminal 464 has the terminal portion 467 disposed directly on the voltage sense wall 1774 of the voltage sense member 1642, and the terminal portion 468 disposed directly on and coupled to the terminal portion 458 of the electrical terminal 454. The terminal portion 458 is sandwiched between the voltage sense wall 1770 and the terminal portion 468.

The voltage sense member 1644 is coupled to the finger portion 1624. The voltage sense member 1644 has voltage sense walls 1790, 1792, 1794. The voltage sense walls 1792, 1794 are coupled to and extend from first and second ends, respectively, of the voltage sense wall 1790. The voltage sense walls 1792, 1794 extend substantially perpendicular to the voltage sense wall 1790. The voltage sense wall 1790 is disposed directly on the flat outer surface 1720 of the finger portion 1624. The voltage sense walls 1792, 1794 are disposed directly on the side surfaces 1722, 1724, respectively, of the finger portion 1624.

The electrical terminal 474 has the terminal portion 477 disposed directly on the voltage sense wall 1792 of the voltage sense member 1644, and the terminal portion 478 disposed directly on and coupled to the voltage sense wall 1790 of the voltage sense member 1644.

The electrical terminal 484 has the terminal portion 487 disposed directly on the voltage sense wall 1794 of the voltage sense member 1644, and the terminal portion 488 disposed directly on and coupled to the terminal portion 478 of the electrical terminal 474. The terminal portion 478 is sandwiched between the voltage sense wall 1790 and the terminal portion 488.

The voltage sense member 1646 is coupled to the finger portion 1626. The voltage sense member 1646 has voltage sense walls 1810, 1812, 1814. The voltage sense walls 1812, 1814 are coupled to and extend from first and second ends, respectively, of the voltage sense wall 1810. The voltage sense walls 1812, 1814 extend substantially perpendicular to the voltage sense wall 1810. The voltage sense wall 1810 is disposed directly on the flat outer surface 1730 of the finger portion 1626. The voltage sense walls 1812, 1814 are disposed directly on the side surfaces 1732, 1734, respectively, of the finger portion 1626.

The electrical terminal 494 has the terminal portion 497 disposed directly on the voltage sense wall 1812 of the voltage sense member 1626, and the terminal portion 498 disposed directly on and coupled to the voltage sense wall 1810 of the voltage sense member 1646.

The electrical terminal 504 has the terminal portion 507 disposed directly on the voltage sense wall 1814 of the voltage sense member 1646, and the terminal portion 508 disposed directly on and coupled to the terminal portion 498 of the electrical terminal 494. The terminal portion 498 is sandwiched between the voltage sense wall 1810 and the terminal portion 508.

The voltage sense member 1648 is coupled to the finger portion 1628. The voltage sense member 1648 has voltage sense walls 1830, 1832, 1834. The voltage sense walls 1832, 1834 are coupled to and extend from first and second ends, respectively, of the voltage sense wall 1830. The voltage sense walls 1832, 1834 extend substantially perpendicular to the voltage sense wall 1830. The voltage sense wall 1830 is disposed directly on the flat outer surface 1740 of the finger portion 1628. The voltage sense walls 1832, 1834 are disposed directly on the side surfaces 1742, 1744, respectively, of the finger portion 1628.

The electrical terminal 514 has the terminal portion 517 disposed directly on the voltage sense wall 1832 of the voltage sense member 1648, and the terminal portion 518 disposed directly on and coupled to the voltage sense wall 1830 of the voltage sense member 1648.

The electrical terminal 524 has the terminal portion 527 disposed directly on the voltage sense wall 1834 of the voltage sense member 1648, and the terminal portion 528 disposed directly on and coupled to the terminal portion 518 of the electrical terminal 514. The terminal portion 518 is sandwiched between the voltage sense wall 1830 and the terminal portion 528.

The voltage sense member 1650 is coupled to the finger portion 1630. The voltage sense member 1650 has voltage sense walls 1850, 1852, 1854. The voltage sense walls 1852, 1854 are coupled to and extend from first and second ends, respectively, of the voltage sense wall 1850. The voltage sense walls 1852, 1854 extend substantially perpendicular to the voltage sense wall 1850. The voltage sense wall 1850 is disposed directly on the flat outer surface 1750 of the finger portion 1630. The voltage sense walls 1852, 1854 are disposed directly on the side surfaces 1852, 1854, respectively, of the finger portion 1630.

The electrical terminal 534 has the terminal portion 537 disposed directly on the voltage sense wall 1852 of the voltage sense member 1650, and the terminal portion 538 disposed directly on and coupled to the voltage sense wall 1850 of the voltage sense member 1650.

The electrical terminal 544 has the terminal portion 547 disposed directly on the voltage sense wall 1854 of the voltage sense member 1650, and the terminal portion 558 disposed directly on and coupled to the terminal portion 538 of the electrical terminal 534. The terminal portion 538 is sandwiched between the voltage sense wall 1850 and the terminal portion 558.

Referring to FIGS. 1 and 20, the removable wire harness assembly 96 is provided to route voltages from the voltage sense members 1640-1650 to a battery management system. The removable wire harness assembly 96 includes spade clips 1940, 1942, 1944, 1946, 1948, 1950, 1952, electrical cables 1960, 1962, 1964, 1966, 1968, 1970, and an electrical connector 1980.

The spade clip 1940 is coupled to the electrical cable 1960 and is further removably physically and electrically coupled to the electrical tab member of the voltage sense member 1640. The electrical cable 1960 is further coupled to the electrical connector 1980.

The spade clip 1942 is coupled to the electrical cable 1962 and is further removably physically and electrically coupled to an electrical tab member of the voltage sense member 1642. The electrical cable 1962 is further coupled to the electrical connector 1980.

The spade clip 1944 is coupled to the electrical cable 1964 and is further removably physically and electrically coupled to an electrical tab member of the voltage sense member 1644. The electrical cable 1964 is further coupled to the electrical connector 1980.

The spade clip 1946 is coupled to the electrical cable 1966 and is further removably physically and electrically coupled to an electrical tab member of the voltage sense member 1646. The electrical cable 1966 is further coupled to the electrical connector 1980.

The spade clip 1948 is coupled to the electrical cable 1968 and is further removably physically and electrically coupled to an electrical tab member of the voltage sense member 1648. The electrical cable 1968 is further coupled to the electrical connector 1980.

The spade clip 1950 is coupled to the electrical cable 1970 and is further removably physically and electrically coupled to an electrical tab member of the voltage sense member 1650. The electrical cable 1970 is further coupled to the electrical connector 1980.

Referring to FIGS. 6 and 23-25 and 29, a flowchart of a method for coupling electrical terminals of battery cells 42, 44, 46, 48 to the interconnect assembly 90 in accordance with an exemplary embodiment will now be described.

At step 2100, a user provides battery cells 42, 44, 46, 48 having electrical terminals 442, 452, 462, 472 respectively. The battery cells 42, 44 are disposed adjacent to one another. The battery cells 46, 48 are disposed adjacent to one another.

At step 2102, the user provides the interconnect assembly 90 having the plate portion 600, finger portions 622, 624, and voltage sense members 642, 644. The finger portions 622, 624 are coupled to and extend from the first end 684 of the plate portion 600. The finger portions 622, 624 extend substantially parallel to one another and are spaced apart from one another. A first gap is defined below the finger portion 622, a second gap is defined between the finger portions 622, 624, and a third gap is defined above the finger portion 624. The finger portion 622 has side surfaces 712, 714 and a flat outer surface 710. The flat outer surface 710 of the finger portion 622 is disposed between the side surfaces 712, 714 of the finger portion 622. The voltage sense member 642 is coupled to the finger portion 622. The voltage sense member 642 has voltage sense walls 770, 772, 774. The voltage sense walls 772, 774 of the voltage sense member 642 are coupled to first and second ends, respectively, of the voltage sense wall 770 of the voltage sense member 642. The voltage sense walls 772, 774 of the voltage sense member 642 extend perpendicular to the voltage sense wall 770 of the voltage sense member 642. The voltage sense wall 770 of the voltage sense member 642 is disposed directly on the flat outer surface 710 of the finger portion 622. The finger portion 624 has side surfaces 712, 714 and a flat outer surface 710. The flat outer surface 710 of the finger portion 624 is disposed between the side surfaces 712, 714 of the finger portion 624. The voltage sense member 644 is coupled to the finger portion 624. The voltage sense member 644 has voltage sense walls 790, 792, 794. The voltage sense walls 792, 794 of the voltage sense member 644 are coupled from first and second ends, respectively, of the voltage sense wall 790 of the voltage sense member 644. The voltage sense walls 792, 794 of the voltage sense member 644 extend perpendicular to the voltage sense wall 790 of the voltage sense member 644. The voltage sense wall 790 of the voltage sense member 644 is disposed directly on the flat outer surface 720 of the finger portion 624.

At step 2104, the user provides a frame member 22 having a first plastic frame 330 and a frame extension portion 332 extending outwardly from the first plastic frame 330.

At step 2106, the user disposes the frame member 22 between the battery cells 44, 46 such that the battery cell 44 is disposed against a first side of the first plastic frame 330, and the battery cell 46 is disposed against a second side of the first plastic frame 330. The frame extension portion 332 extends through the second gap substantially parallel to the finger portions 622, 624.

At step 2108, the placement machine 2400 disposes the interconnect assembly 90 proximate to the battery cells 42, 44, 46, 48 such that the electrical terminal 442 extends through the first gap, the electrical terminal 452 extends through the second gap between the frame extension portion 332 and the finger portion 622, the electrical terminal 462 extends through the second gap between the frame extension portion 332 and the finger portion 624, and the electrical terminal 472 extends through the third gap.

At step 2110, the placement machine 2400 disposes the terminal portion 446 of the electrical terminal 442 directly on the voltage sense wall 770 of the voltage sense member 642.

At step 2112, the placement machine 2400 disposes the terminal portion 456 of the electrical terminal 452 directly on the terminal portion 446 of the electrical terminal 442 such that the terminal portion 446 of the electrical terminal 442 is sandwiched between the voltage sense wall 770 of the voltage sense member 642 and the terminal portion 456 of the electrical terminal 452.

At step 2114, the placement machine 2400 disposes a terminal portion 466 of the electrical terminal 462 directly on the voltage sense wall 790 of the voltage sense member 644.

At step 2116, the placement machine 2400 disposes of the terminal portion 476 of the electrical terminal 472 directly on the terminal portion 466 of the electrical terminal 462 such that the terminal portion 466 of the electrical terminal 462 is sandwiched between the voltage sense wall 790 of the voltage sense member 644 and the terminal portion 476 of the electrical terminal 472.

At step 2118, a laser 2404 emits a first laser beam to weld the terminal portion 446 of the electrical terminal 442 and the terminal portion 456 of the electrical terminal 452 to the voltage sense member 642.

At step 2120, the laser 2404 emits a second laser beam to weld a terminal portion 466 of the electrical terminal 462 and the terminal portion 476 of the electrical terminal 472 to the voltage sense member 644. The frame extension portion 332 electrically isolates the electrical terminal 452 from the electrical terminal 462.

Referring to FIGS. 7, 22 and 26-29, a flowchart of a method for coupling electrical terminals of battery cells 40, 42, 44, 46 to the interconnect assembly 94 in accordance with another exemplary embodiment will now be described.

At step 2300, a user provides battery cells 40, 42, 44, 46 having electrical terminals 434, 444, 454, 464, respectively.

At step 2302, the user provides the interconnect assembly 94 having the plate portion 1600, the finger portions 1620, 1622, the blade portion 1633, and the voltage sense members 1640, 1642. The finger portion 1620 is coupled to and extends from the first end 1684 of the plate portion 1600. The finger portion 1620 having side surfaces 1702, 1704 and a flat outer surface 1700. The flat outer surface 1700 of the finger portion 1620 is disposed between the side surfaces 1702, 1704 of the finger portion 1620. The voltage sense member 1640 is coupled to the finger portion 1620. The voltage sense member 1640 has a voltage sense wall 1760 disposed directly on the flat outer surface 1700 of the finger portion 1620. The finger portion 1622 is coupled to and extends from the first end 1684 of the plate portion 1600. The finger portion 1622 extends substantially parallel to the finger portion 1620 and is spaced apart from the finger portion 1620. The finger portion 1622 has side surfaces 1712, 1714 and a flat outer surface 1710. The flat outer surface 1710 of the finger portion 1622 is disposed between the side surfaces 1712, 1714 of the finger portion 1622. The voltage sense member 1622 is coupled to the finger portion 1622. The voltage sense member 1622 has a voltage sense wall 1770 that is disposed directly on the flat outer surface 1710 of the finger portion 1622. The blade portion 1633 is coupled to and extends from the first end 1684 of the plate portion 1600. The blade portion 1633 extends substantially parallel to the finger portion 1620, 1622 and is disposed between the finger portions 1620, 1622. A first gap is defined below the finger portion 1620. A second gap is defined between the finger portion 1620 and the blade portion 1633. A third gap is defined between the finger portion 1622 and the blade portion 1633. Further, a fourth gap is defined above the finger portion 1622.

At step 2304, the user provides the frame member 20 and disposes the frame member 20 between the battery cells 40, 42 such that the battery cell 40 is disposed against a first side of the frame member 20, and the battery cell 42 is disposed against a second side of frame member 20.

At step 2306, the user provides the frame member 22 and disposes the frame member 22 between the battery cells 44, 46 such that the battery cell 44 is disposed against a first side of the frame member 22, and the battery cell 46 is disposed against a second side of the frame member 22.

At step 2308, the placement machine 2400 disposes the interconnect assembly 94 proximate to the battery cells 40, 42, 44, 46 such that the electrical terminal 434 extends through the first gap, the electrical terminal 444 extends through the second gap, the electrical terminal 454 extends through the third gap, and the electrical terminal 464 extends through the fourth gap.

At step 2310, the placement machine 2400 disposes the terminal portion 438 of the electrical terminal 434 directly on the voltage sense wall 1760 of the voltage sense member 1640.

At step 2312, the placement machine 2400 disposes the terminal portion 448 of the electrical terminal 444 directly on the terminal portion 438 of the electrical terminal 434 such that the terminal portion 438 of the electrical terminal 434 is sandwiched between the voltage sense wall 1760 of the voltage sense member 1640 and the terminal portion 448 of the electrical terminal 444.

At step 2314, the placement machine 2400 disposes the terminal portion 458 of the electrical terminal 454 directly on the voltage sense wall 1770 of the voltage sense member 1622.

At step 2316, the placement machine 2400 disposes the terminal portion 468 of the electrical terminal 464 directly on the terminal portion 458 of the electrical terminal 454 such that the terminal portion 458 of the electrical terminal 454 is sandwiched between the voltage sense wall 1770 of the voltage sense member 1622 and the terminal portion 468 of the electrical terminal 464.

At step 2318, the laser 2404 emits a first laser beam to weld the terminal portion 438 of the electrical terminal 434 and the terminal portion 448 of the electrical terminal 444 to the voltage sense member 1640.

At step 2320, the laser 2404 emits a second laser beam to weld the terminal portion 458 of the electrical terminal 454 and the terminal portion 468 of the electrical terminal 464 to the voltage sense member 1622, and the blade portion 1633 electrically isolating the electrical terminal 444 from the electrical terminal 454.

Figure 29:
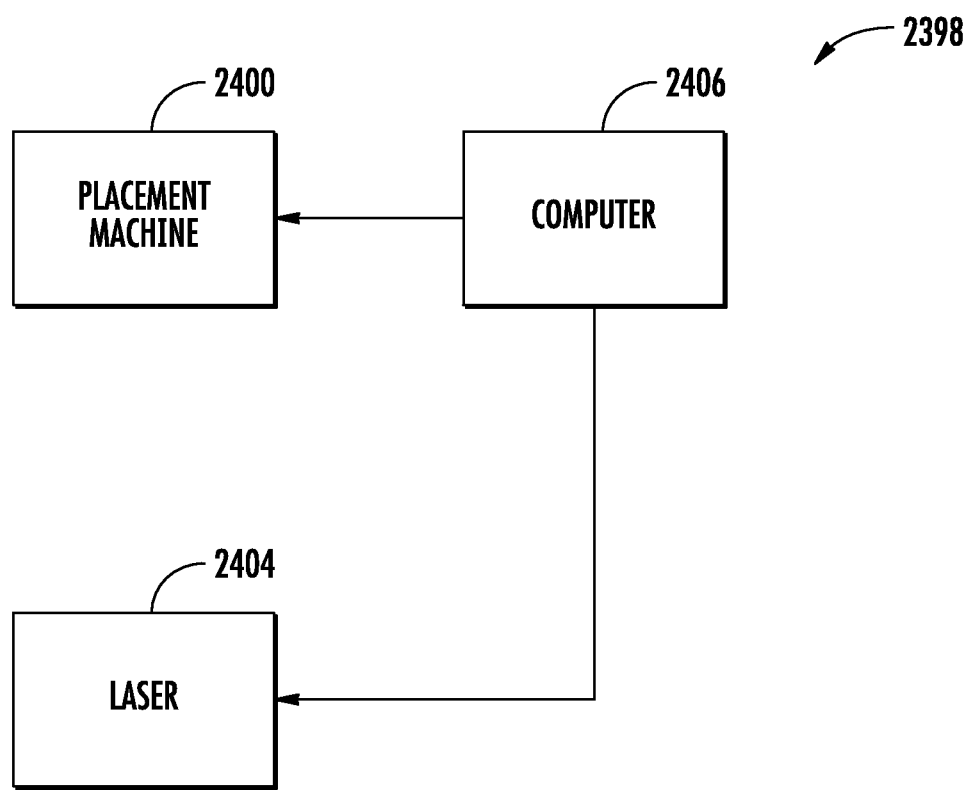
FIG. 29 is a block diagram of a system of coupling electrical terminals of battery cells to the first and second interconnect assemblies of FIGS. 13 and 19.

Referring to FIG. 29, a system 2398 for performing at least a portion of the steps in the above described flowcharts is illustrated. The system 2398 includes the placement machine 2400 and the laser 2404 that are operably coupled to the computer 2406. The computer 2406 includes a memory device that is programmed with software programs to implement at least a portion of the steps in the above described flowcharts. In particular, the computer 2406 to generate signals to induce the placement machine 2400 and the laser 2404 to perform the steps associated with the placement machine 2400 and the laser 2404 in the above described flowcharts.

The battery module and the method of coupling first and second electrical terminals of first and second battery cells, respectively, to a voltage sense member of an interconnect assembly provide a substantial advantage over other battery modules and methods. In particular, the battery module utilizes an interconnect assembly having a plate portion, a finger portion extending from the plate portion, and a voltage sense member disposed on the finger portion. The first and second electrical terminals are disposed on opposite sides of the finger portion, and a portion of the first electrical terminal is disposed directly on a flat outer surface of the voltage sense member, and a portion of the second electrical terminal is disposed directly on the portion of the first electrical terminal. Thereafter, the first and second electrical terminals are welded to the voltage sense member utilizing a laser beam from a laser.

While the claimed invention has been described in detail in connection with only a limited number of embodiments, it should be readily understood that the invention is not limited to such disclosed embodiments. Rather, the claimed invention can be modified to incorporate any number of variations, alterations, substitutions or equivalent arrangements not heretofore described, but which are commensurate with the spirit and scope of the invention. Additionally, while various embodiments of the claimed invention have been described, it is to be understood that aspects of the invention may include only some of the described embodiments. Accordingly, the claimed invention is not to be seen as limited by the foregoing description.

What is claimed is:

1. A battery module, comprising:
a first battery cell having a first electrical terminal;
a second battery cell having a second electrical terminal;
an interconnect assembly having a plate portion, a first finger portion, and a first voltage sense member;
the first finger portion being coupled to and extending from a first end of the plate portion, the first finger portion having first and second side surfaces and a first flat outer surface, the first flat outer surface of the first finger portion being disposed between the first and second side surfaces of the first finger portion;
the first voltage sense member being coupled to the first finger portion, the first voltage sense member having first, second, and third voltage sense walls; the second and third voltage sense walls of the first voltage sense member being coupled to and extending from first and second ends, respectively, of the first voltage sense wall of the first voltage sense member; the second and third voltage sense walls of the first voltage sense member extending substantially perpendicular to the first voltage sense wall of the first voltage sense member; the first voltage sense wall of the first voltage sense member being disposed directly on the first flat outer surface of the first finger portion; the second and third voltage sense walls of the first voltage sense member being disposed directly on the first and second side surfaces, respectively, of the first finger portion;

the first electrical terminal having a first terminal portion disposed directly on and coupled to the first voltage sense wall of the first voltage sense member;

the second electrical terminal having a first terminal portion disposed on and coupled to the first terminal portion of the first electrical terminal such that the first terminal portion of the first electrical terminal is sandwiched between the first voltage sense wall of the first voltage sense member and the first terminal portion of the second electrical terminal;

the first electrical terminal further includes a second terminal portion being disposed directly on the second voltage sense wall of the first voltage sense member; and the second electrical terminal further includes a second terminal portion being disposed directly on the third voltage sense wall of the first voltage sense member.

2. The battery module of claim 1, wherein the first finger portion has a T-shaped cross-sectional profile along a plane extending through first finger portion that is substantially parallel to the first end of the plate portion.

3. The battery module of claim 1, wherein the plate portion and the first finger portion are each constructed of plastic, and the first voltage sense member is constructed of a metal.

4. A battery module, comprising:
a first battery cell having a first electrical terminal;
a second battery cell having a second electrical terminal;
an interconnect assembly having a plate portion, a first finger portion, and a first voltage sense member;
the first finger portion being coupled to and extending from a first end of the plate portion, the first finger portion having first and second side surfaces and a first flat outer surface, the first flat outer surface of the first finger portion being disposed between the first and second side surfaces of the first finger portion;
the first voltage sense member being coupled to the first finger portion, the first voltage sense member having first, second, and third voltage sense walls; the second and third voltage sense walls of the first voltage sense member being coupled to and extending from first and second ends, respectively, of the first voltage sense wall of the first voltage sense member; the second and third voltage sense walls of the first voltage sense member extending substantially perpendicular to the first voltage sense wall of the first voltage sense member; the first voltage sense wall of the first voltage sense member being disposed directly on the first flat outer surface of the first finger portion; the second and third voltage sense walls of the first voltage sense member being disposed directly on the first and second side surfaces, respectively, of the first finger portion;
the first electrical terminal having a first terminal portion disposed directly on and coupled to the first voltage sense wall of the first voltage sense member;
the second electrical terminal having a first terminal portion disposed on and coupled to the first terminal portion of the first electrical terminal such that the first terminal portion of the first electrical terminal is sandwiched between the first voltage sense wall of the first voltage sense member and the first terminal portion of the second electrical terminal;
a third battery cell having a third electrical terminal;
a fourth battery cell having a fourth electrical terminal;
the interconnect assembly further having a second finger portion and a second voltage sense member;

the second finger portion being coupled to an extending from the first end of the plate portion, the second finger portion extending substantially parallel to the first finger portion and being spaced apart from the first finger portion, the second finger portion having first and second side surfaces and a first flat outer surface, the first flat outer surface of the second finger portion being disposed between the first and second side surfaces of the second finger portion;

the second voltage sense member being coupled to the second finger portion, the second voltage sense member having first, second, and third voltage sense walls; the second and third voltage sense walls of the second voltage sense member being coupled to and extending from first and second ends, respectively, of the first voltage sense wall of the second voltage sense member; the second and third voltage sense walls of the second voltage sense member extending substantially perpendicular to the first voltage sense wall of the second voltage sense member; the first voltage sense wall of the second voltage sense member being disposed directly on the first flat outer surface of the second finger portion; the second and third voltage sense walls of the second voltage sense member being disposed directly on the first and second side surfaces, respectively, of the second finger portion;

the third electrical terminal having a first terminal portion disposed directly on and coupled to the first voltage sense wall of the second voltage sense member;

the fourth electrical terminal having a first terminal portion disposed on and coupled to the first terminal portion of the third electrical terminal such that the first terminal portion of the third electrical terminal is sandwiched between the first voltage sense wall of the second voltage sense member and the first terminal portion of the fourth electrical terminal;

a first frame member having a frame extension portion;
the first and second battery cells being disposed against and contacting one another;
the third and fourth battery cells being disposed against and contacting one another; and
the first frame member being disposed against and contacting the second and third battery cells such that the frame extension portion is disposed in a gap between the second and third electrical terminals of the second and third battery cells, respectively, to electrically isolate the second electrical terminal from the third electrical terminal.

5. The battery module of claim 1, wherein the first voltage sense member further includes first and second coupling members coupled to and extending from third and fourth ends, respectively, of the first voltage sense wall; the first and second coupling members adapted to hold the first voltage sense member on the first flat outer surface of the first finger portion.

6. The battery module of claim 5, wherein the third side surface of the first finger portion defines an electrical connector tab.

7. The battery module of claim 4, wherein the first frame member further includes a first substantially rectangular ring-shaped outer plastic frame and a first heat exchanger;
the first heat exchanger having first and second thermally conductive plates being coupled together and defining a first flow path portion extending therethrough, the first flow path portion having at least first and second flow path subportions each extending through the first and second thermally conductive plates;

the first substantially rectangular ring-shaped outer plastic frame being coupled around an outer peripheral region of the first and second thermally conductive plates; the first substantially rectangular ring-shaped outer plastic frame having first, second, third, and fourth side walls; the first and second side walls extending substantially parallel to one another; the third and fourth side walls being coupled between the first and second side walls and extending substantially parallel to one another and perpendicular to the first and second side walls; the first side wall having first and second apertures extending therethrough that communicate with the first and second flow path subportions, respectively; the second side wall having third and fourth apertures extending therethrough that communicate with the first and second flow path subportions, respectively;

the frame extension portion extending outwardly from the third side wall of the first substantially rectangular ring-shaped outer plastic frame;

the second battery cell being disposed on and against a side of the first thermally conductive plate; and the third battery cell being disposed on and against a side of the second thermally conductive plate.

\* \* \* \* \*